(12) United States Patent
Kurosawa et al.

(10) Patent No.: US 11,513,735 B2
(45) Date of Patent: Nov. 29, 2022

(54) MEMORY SYSTEM AND INFORMATION PROCESSING SYSTEM

(71) Applicant: Kioxia Corporation, Tokyo (JP)

(72) Inventors: Yasuhiko Kurosawa, Fujisawa (JP); Naomi Takeda, Yokohama (JP); Masanobu Shirakawa, Chigasaki (JP); Yasuyuki Ushijima, Yokohama (JP); Shinichi Kanno, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/190,496

(22) Filed: Mar. 3, 2021

(65) Prior Publication Data

US 2022/0075562 A1 Mar. 10, 2022

(30) Foreign Application Priority Data

Sep. 10, 2020 (JP) .............................. JP2020-151960

(51) Int. Cl.
| | | |
|---|---|---|
| G11C 29/00 | (2006.01) | |
| G06F 3/06 | (2006.01) | |
| G06F 11/10 | (2006.01) | |
| G06F 13/16 | (2006.01) | |
| G06F 13/42 | (2006.01) | |
| G11C 16/26 | (2006.01) | |
| G11C 16/04 | (2006.01) | |
| G11C 11/56 | (2006.01) | |

(52) U.S. Cl.
CPC .......... *G06F 3/0659* (2013.01); *G06F 3/0604* (2013.01); *G06F 3/0679* (2013.01); *G06F 11/1068* (2013.01); *G06F 13/1668* (2013.01); *G06F 13/4282* (2013.01); *G11C 16/0483* (2013.01); *G11C 16/26* (2013.01); *G06F 2213/0026* (2013.01); *G06F 2213/0028* (2013.01); *G06F 2213/0032* (2013.01); *G11C 11/5621* (2013.01); *G11C 11/5671* (2013.01)

(58) Field of Classification Search
CPC .... G06F 3/0659; G06F 3/0604; G06F 3/0679; G06F 11/1068; G06F 13/1668; G06F 13/4282; G11C 16/26; G11C 16/0483; G11C 11/5671; G11C 11/5621
See application file for complete search history.

(56) References Cited

U.S. PATENT DOCUMENTS

| | | | |
|---|---|---|---|
| 9,465,537 B2 | 10/2016 | Nishikubo et al. | |
| 9,836,219 B2 | 12/2017 | Kim et al. | |
| 2015/0331625 A1* | 11/2015 | Nishikubo | ............ G06F 3/0655 711/103 |
| 2019/0074283 A1* | 3/2019 | Amaki | ................ H01L 27/1157 |
| 2020/0083240 A1* | 3/2020 | Amaki | .................... G11C 16/16 |
| 2020/0090762 A1 | 3/2020 | Shirakawa et al. | |
| 2022/0093198 A1 | 3/2022 | Takeda et al. | |

FOREIGN PATENT DOCUMENTS

| | | |
|---|---|---|
| JP | 2020-047337 A | 3/2020 |
| JP | 2022-51340 A | 3/2022 |

\* cited by examiner

*Primary Examiner* — Samir W Rizk
(74) *Attorney, Agent, or Firm* — Oblon, McClelland, Maier & Neustadt, L.L.P.

(57) ABSTRACT

According to one embodiment, a memory system includes a nonvolatile memory and a memory controller configured to execute a patrol process, in response to a first command set from a host device. In the patrol process, the memory controller is configured to read first data from the nonvolatile memory, and not to output the first data to the host device.

20 Claims, 31 Drawing Sheets

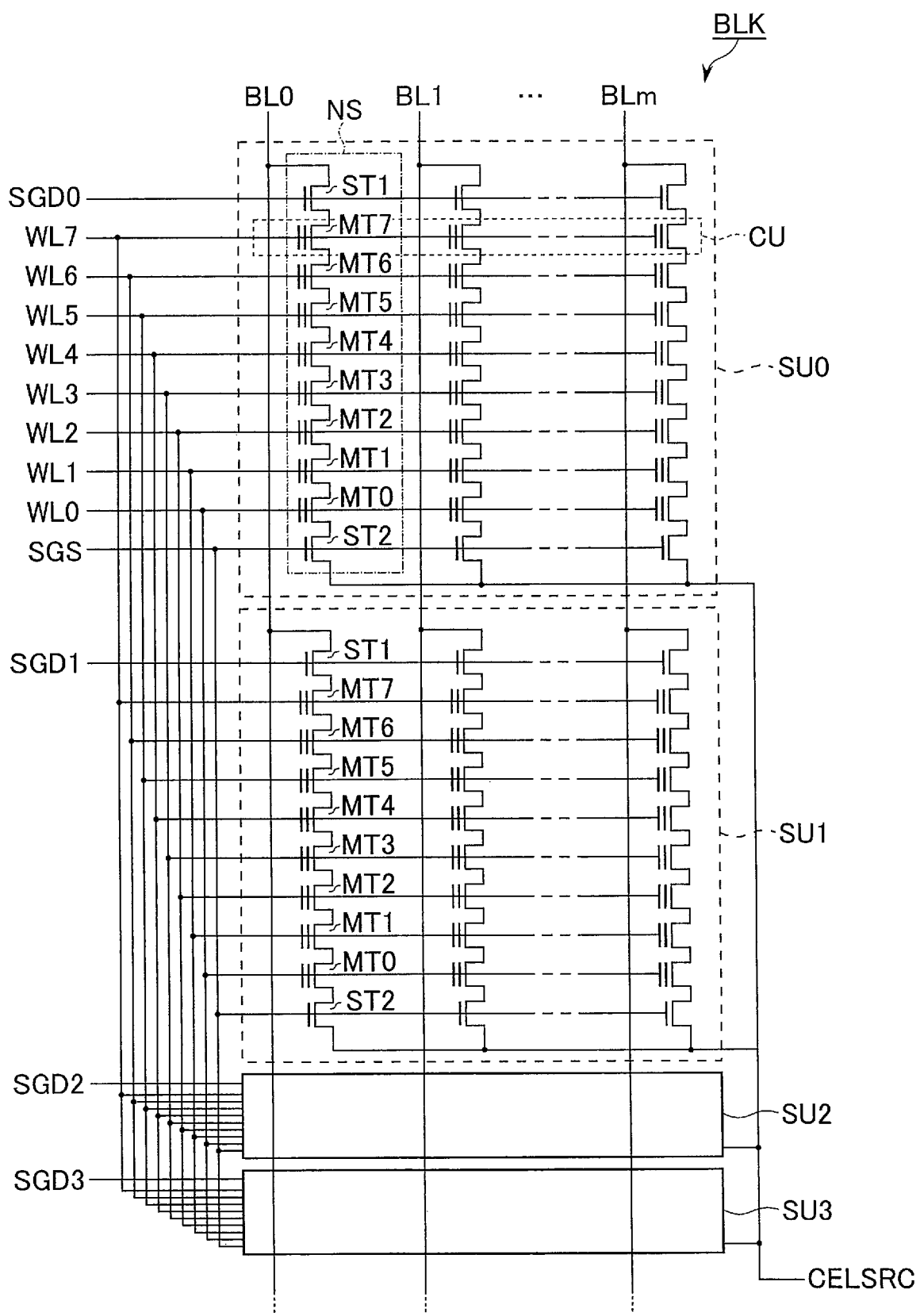
F I G. 3

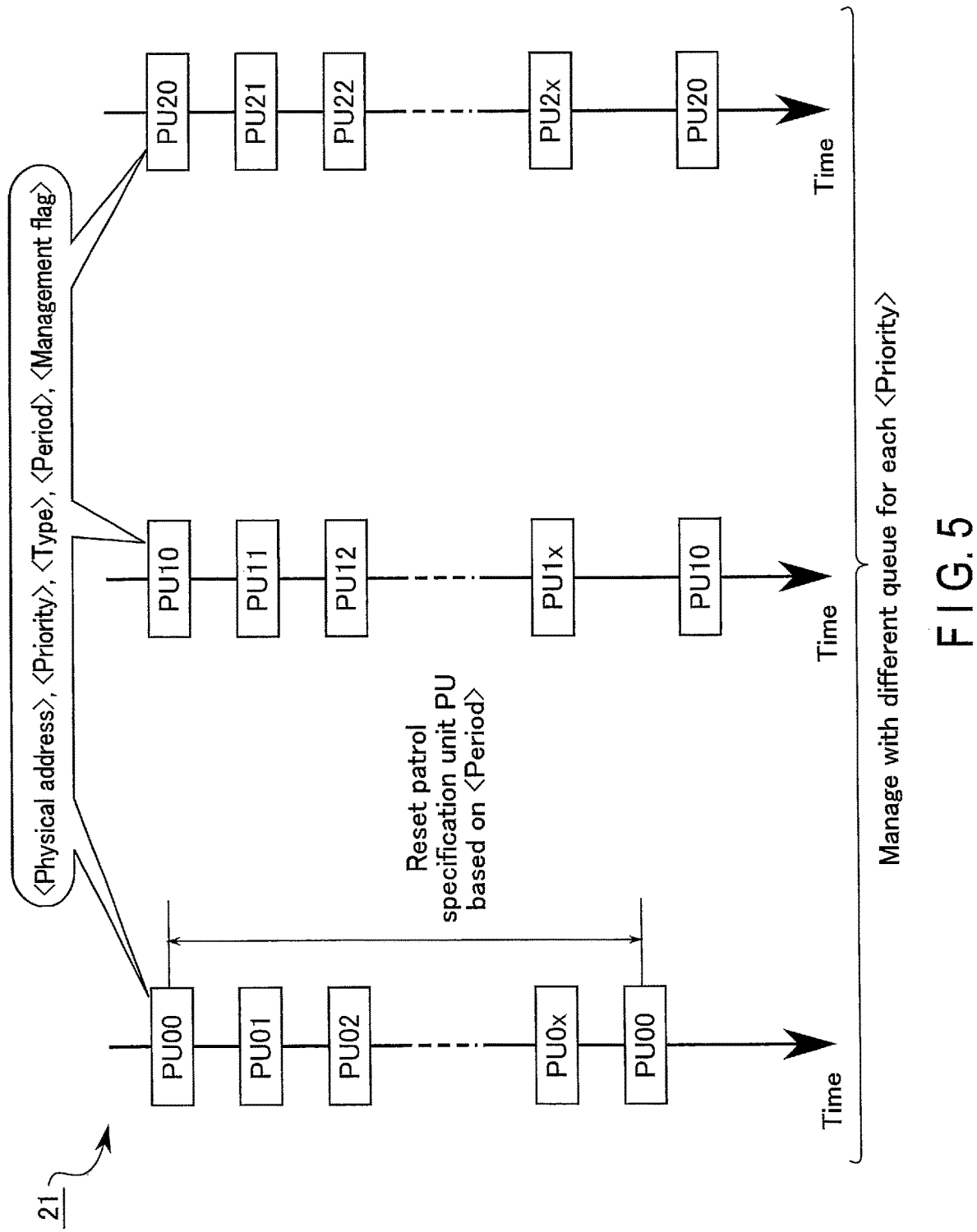
F I G. 5

| Physical address ⟨Chip-BLK-WL-SU-P⟩ | | Range specification | | | | |
|---|---|---|---|---|---|---|
| | | Chip ⟨Chip⟩ | Block ⟨BLK⟩ | Word line ⟨WL⟩ | String unit ⟨SU⟩ | Page ⟨P⟩ |
| All | | ⟨all Chip⟩ | ⟨all BLK⟩ | ⟨all WL⟩ | ⟨all SU⟩ | ⟨all P⟩ |
| Element specification | Individual | ⟨Chip Xc⟩ (0≤Xc≤N) | ⟨BLK Xb⟩ (0≤Xb≤n) | ⟨WL Xw⟩ (0≤Xw≤7) | ⟨SU Xs⟩ (0≤Xs≤3) | ⟨P Xp⟩ (Xp=0:Lower, Xp=1:Middle, Xp=2:Upper, Xp=3:Top) |

F I G. 6

(A)

| Priority <Pr> | Note |
|---|---|
| Pr0 | Highest priority |
| Pr1 | Next highest priority after read process |
| Pr2 | At the end |
| Pr3 | Executed after host command is processed predetermined times |

(B)

| Type <W> | Note |
|---|---|
| WCheck | Check patrol process |
| WUpdate | Update patrol process |

(C)

| Period <Pe> | Note |
|---|---|
| Pe12H | Every 12 hours |
| Pe1D | Every day |
| Pe2D | Every 2 days |
| Pe4D | Every 4 days |
| Pe8D | Every 8 days |

(D)

| Management flag <F> | Note |
|---|---|
| FReset | Flag reset |
| FPatrol | Forced patrol |

| Chip | Block | Refresh flag |
|---|---|---|
| Chip0 | BLK0 | True |
| | BLK1 | False |
| | ⋮ | ⋮ |
| | BLKn | False |
| Chip1 | BLK0 | False |
| | ⋮ | ⋮ |
| | BLKn | False |
| ⋮ | ⋮ | ⋮ |
| ChipN | BLK0 | False |
| | ⋮ | ⋮ |
| | BLKn | False |

F I G. 8

23

| Patrol specification unit | Priority |
|---|---|
| PU10 | Pr1 |
| PU20 | Pr2 |
| PU21 | Pr2 |
| ⋮ | ⋮ |

F I G. 9

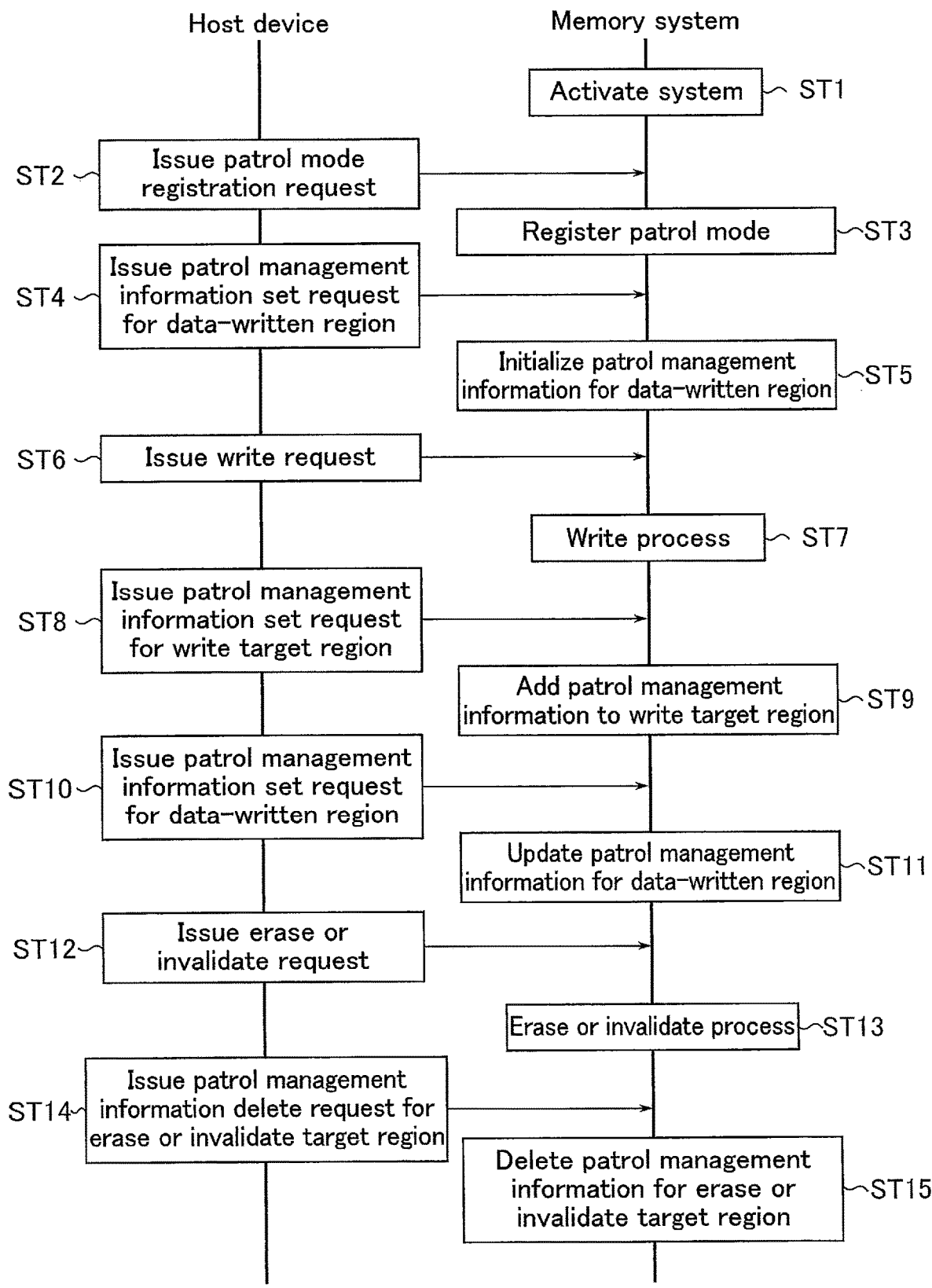
F I G. 10

F I G. 16

| Block | BLK0 | BLK1 | BLK2 | ... | BLKn |
|---|---|---|---|---|---|
| Patrol mode | A | C | — | ... | A |
| Period Pe | Four-day | Eight-day | — | ... | Four-day |
| Execution identifier ADD1 | 1 | 1 | — | ... | 1 |
| Execution identifier ADD2 | 2 | 2 | — | ... | 2 |
| Execution identifier ADD3 | 3 | 3 | — | ... | 3 |
| Execution identifier ADD4 | 0 | 4 | — | ... | 0 |
| Execution identifier ADD5 | 1 | 5 | — | ... | 1 |
| Execution identifier ADD6 | 2 | 6 | — | ... | 2 |
| Execution identifier ADD7 | 3 | 7 | — | ... | 3 |
| Execution identifier ADD8 | 0 | 0 | — | ... | 0 |

F I G. 23

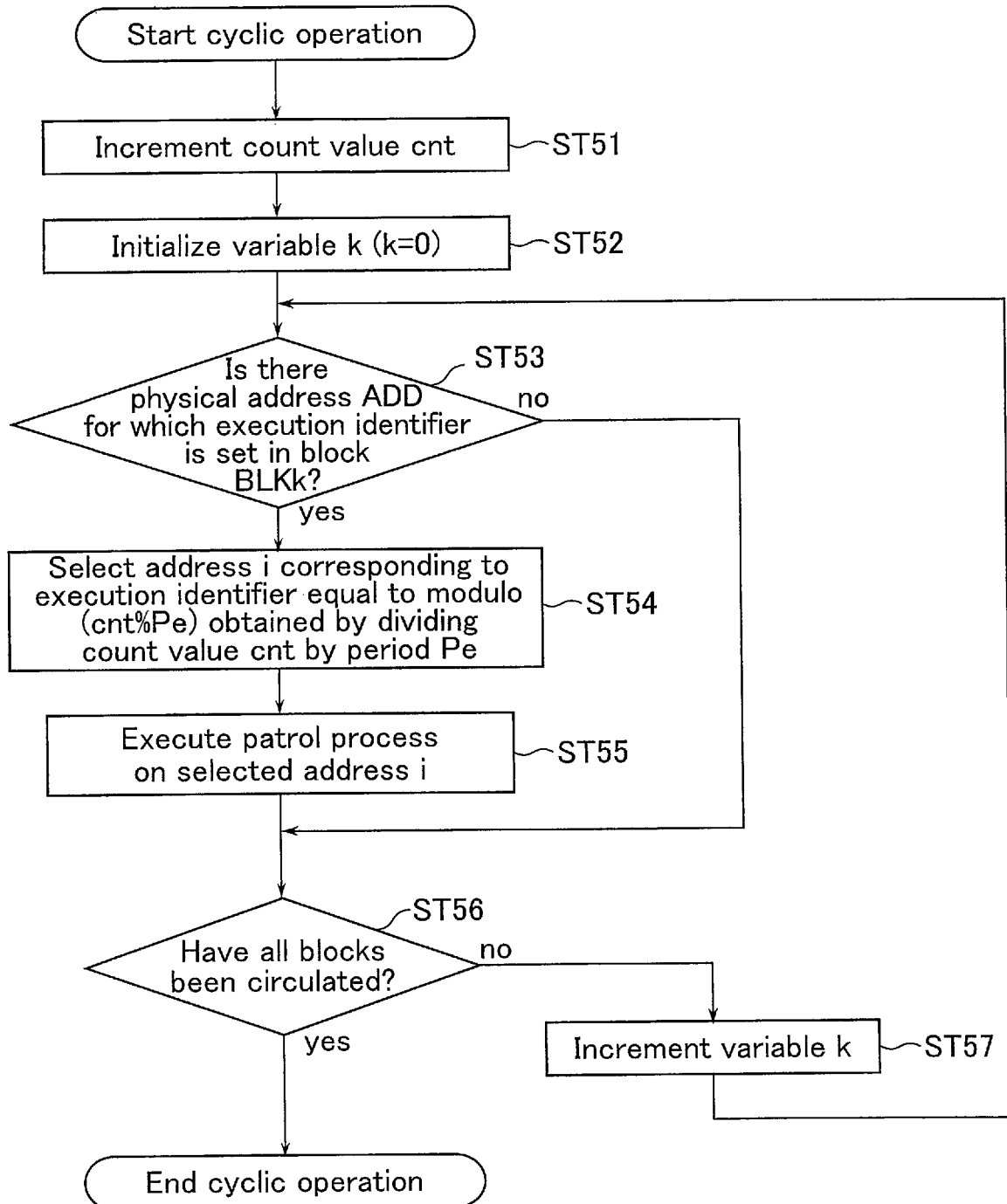
F I G. 24

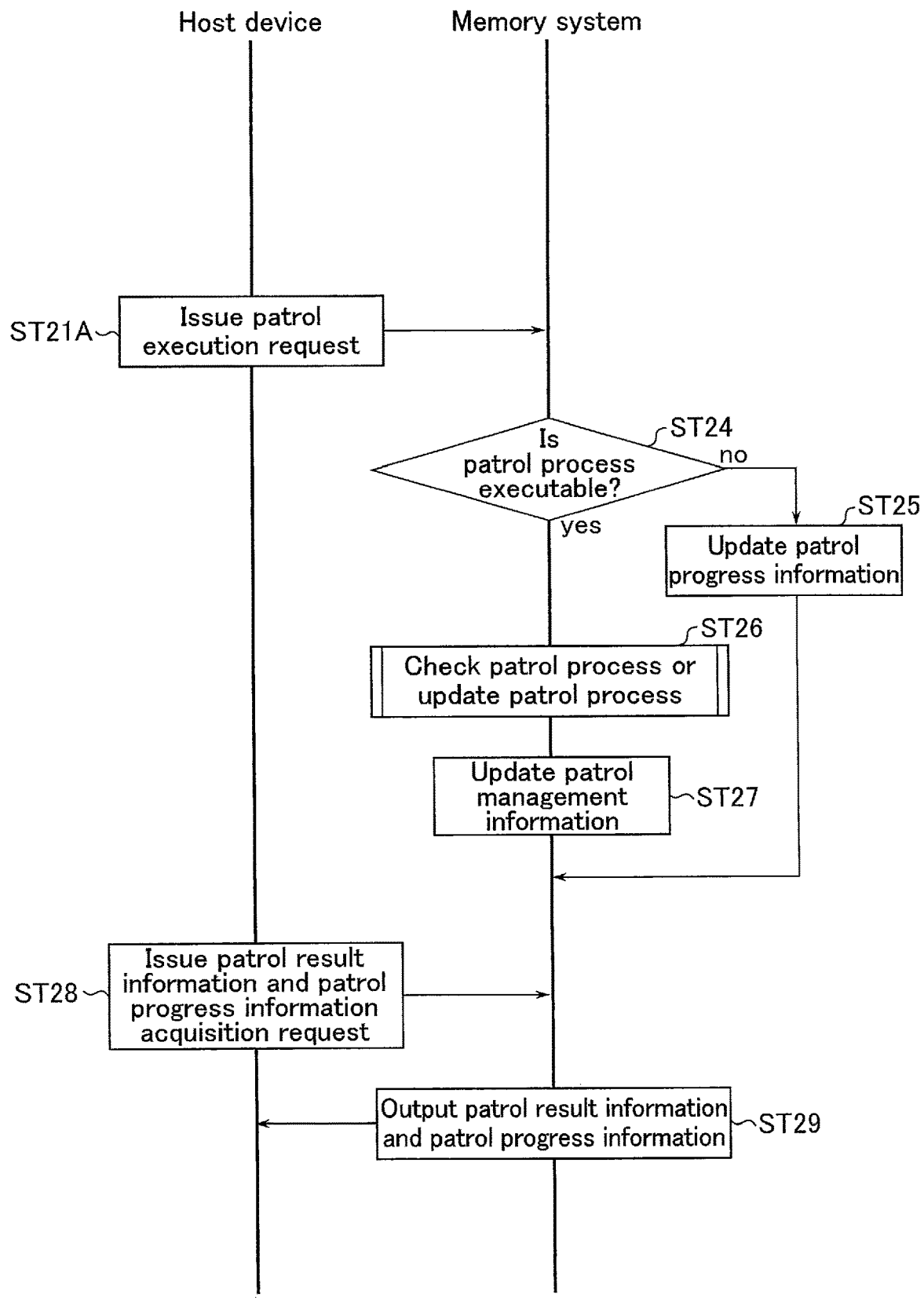
F I G. 25

| Block | BLK0 | BLK1 | BLK2 | ... | BLKn |
|---|---|---|---|---|---|
| Specified patrol mode | B0 | B2 | – | ... | B3 |
| Recommended patrol mode | B0 | B1 | B1 | ... | B2 |

F I G. 27

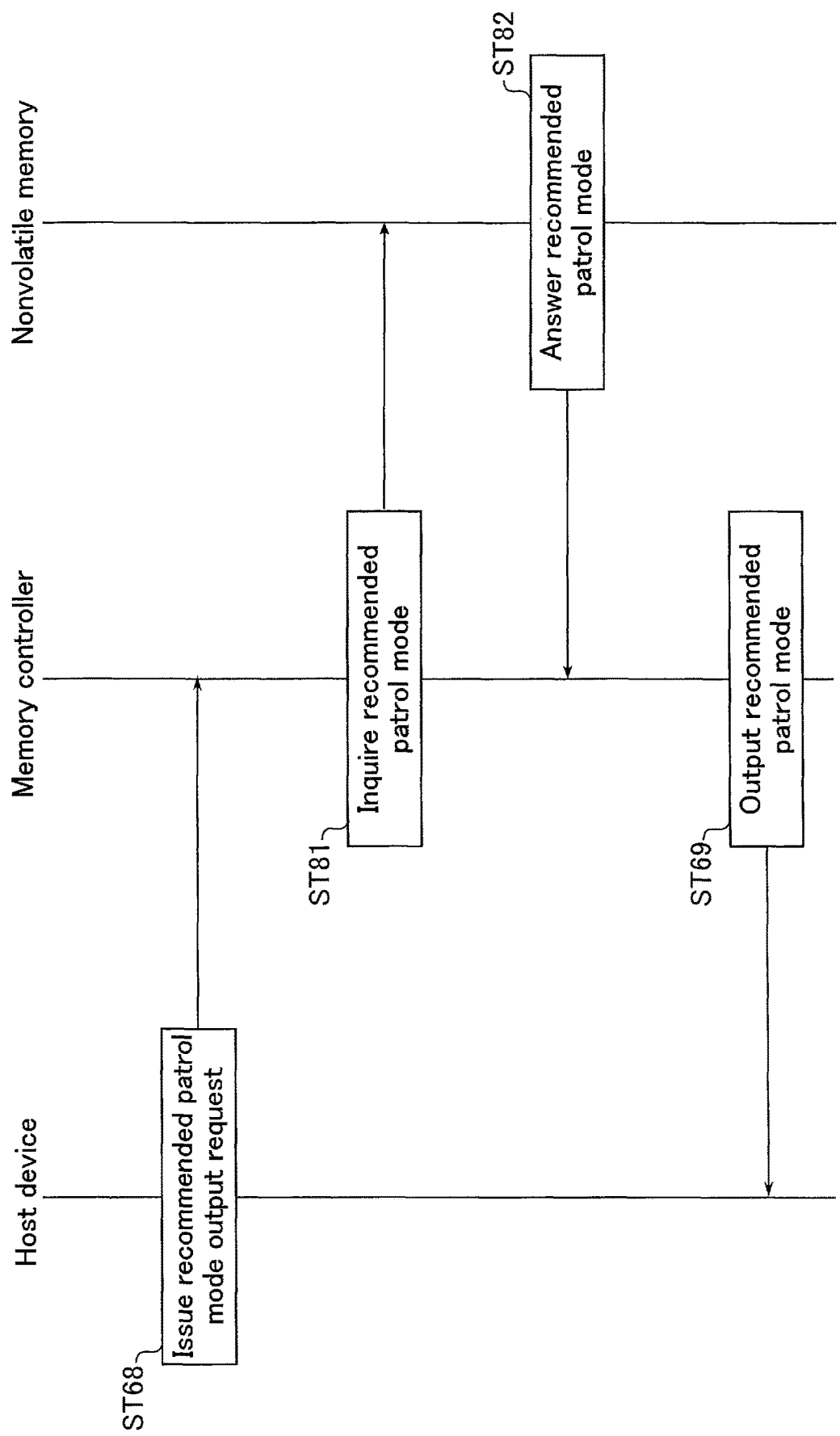
F I G. 30

MEMORY SYSTEM AND INFORMATION PROCESSING SYSTEM

CROSS-REFERENCE TO RELATED APPLICATIONS

This application is based upon and claims the benefit of priority from Japanese Patent Application No. 2020-151960, filed Sep. 10, 2020, the entire contents of which are incorporated herein by reference.

FIELD

Embodiments described herein relate generally to a memory system and an information processing system.

BACKGROUND OF THE INVENTION

An information processing system including a memory system and a host device controlling the memory system is known. The memory system includes a NAND flash memory as a nonvolatile memory, and a memory controller controlling the nonvolatile memory.

BRIEF DESCRIPTION OF THE DRAWINGS

FIG. 3 is a circuit diagram for illustrating a configuration of a memory cell array of the nonvolatile memory according to the first embodiment;

FIG. 5 is a conceptional diagram for illustrating patrol management information of the information processing system according to the first embodiment;

FIG. 6 is a conceptional diagram for illustrating details of the patrol management information of the information processing system according to the first embodiment;

FIG. 7 is a conceptional diagram for illustrating details of the patrol management information of the information processing system according to the first embodiment;

FIG. 8 is a conceptual diagram for illustrating patrol result information of the information processing system according to the first embodiment;

FIG. 9 is a conceptual diagram for illustrating patrol progress information of the information processing system according to the first embodiment;

FIG. 10 is a flowchart for illustrating a patrol management operation in the information processing system according to the first embodiment;

FIG. 16 is a schematic diagram for illustrating the third example of the patrol mode registered in the information processing system according to the first embodiment;

FIG. 23 is a conceptional diagram for illustrating patrol management information of information processing system according to a modification of the first embodiment;

FIG. 24 is a flowchart for illustrating a cyclic operation in the information processing system according to the modification of the first embodiment;

FIG. 25 is a flowchart for illustrating a series of operations including a patrol process in an information processing system according to a second embodiment;

FIG. 27 is a conceptional diagram for illustrating patrol management information of an information processing system according to a third embodiment;

FIG. 30 is a flowchart for illustrating a patrol mode output operation in an information processing system according to a modification of the third embodiment;

DETAILED DESCRIPTION

Figure 1:
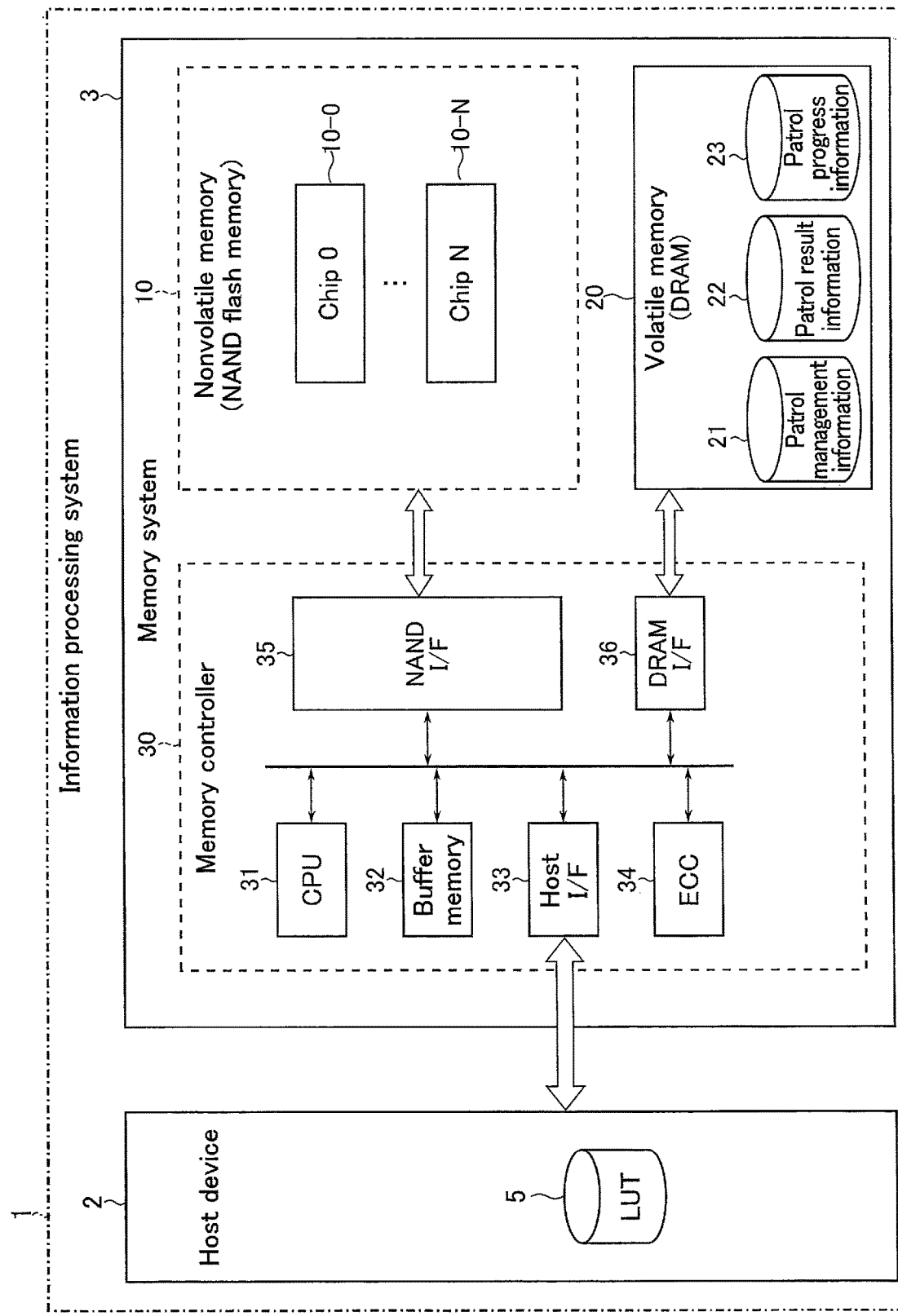
FIG. 1 is a block diagram for illustrating a configuration of an information processing system including a memory system according to a first embodiment.

In general, according to one embodiment, a memory system includes a nonvolatile memory and a memory controller configured to execute a patrol process, in response to a first command set from a host device. In the patrol process, the memory controller is configured to read first data from the nonvolatile memory, and not to output the first data to the host device.

Hereinafter, embodiments will be described with reference to the drawings. In the following description, constituent elements having the same function and configuration will be assigned common reference numerals. If it is necessary to distinguish structural elements having the same reference symbols from each other, an additional symbol is added after the reference symbol. When a plurality of elements are not particularly distinguished from each other, the elements are assigned with only a common reference numeral or symbol without an accompanying numeral or symbol.

1. First Embodiment

An information processing system according to the first embodiment will be described.

1.1 Configuration

1.1.1 Information Processing System

With reference to FIG. 1, a configuration of the information processing system according to the first embodiment will be described.

As illustrated in FIG. 1, an information processing system 1 includes a host device 2 and a memory system 3.

The host device 2 is, for example, a server in a data center, a personal computer, or the like, and stores a lookup table 5. The lookup table 5 is information that associates address information (logical address) uniquely identifying data stored in the memory system 3 and address information (physical address) uniquely identifying a memory region in the memory system 3 in which the data is stored. The host device 2 is configured to provide instructions on in which physical address in the memory system 3 the data is written (or from which physical address the data is read) based on the lookup table 5.

The memory system 3 is, for example, System-on-a-Chip (SoC), and instructs the nonvolatile memory 10 in the memory system 3 to read, write, and erase data in response to a command from the host device 2.

1.1.2 Memory System

With continuous reference to FIG. 1, a configuration of the memory system according to the first embodiment will be described.

The memory system 3 includes a nonvolatile memory 10, a volatile memory 20, and a memory controller 30, and is coupled to the host device 2. The nonvolatile memory 10, the volatile memory 20, and the memory controller 30 may form one semiconductor device in combination, an example of which includes a memory card such as an SD™ card, a universal flash storage (UFS), or a solid state drive (SSD).

The nonvolatile memory 10 (hereinafter, NAND flash memory 10) includes, for example, a plurality of chips 10-0 to 10-N each including a plurality of memory cell transistors, and stores, in a nonvolatile manner, data which the host device 2 instructed the nonvolatile memory 10 to write (N being an integer equal to or greater than 1). The nonvolatile memory 10 may include one chip, not limited to a case where the nonvolatile memory 10 includes a plurality of chips as shown in FIG. 1. The chips 10-0 to 10-N may have different device IDs or the same device ID. The device ID is information for identifying, for example, a chip manufacturer, model number, lot number, and the like. In the following description, the chips 10-0 to 10-N may be described as Chip 0 to Chip N, respectively, for convenience.

The volatile memory 20 (hereinafter, DRAM 20) is, for example, a dynamic random access memory (DRAM), and stores firmware for managing the NAND flash memory 10 and various management information. For example, the DRAM 20 stores patrol management information 21, patrol result information 22, and patrol progress information 23, as information items for controlling patrol process.

The patrol process includes a read process executed regularly or irregularly for reading data stored in the NAND flash memory 10 with a small number of error bits, and for example includes a check patrol process and an update patrol process. The data read from the NAND flash memory 10 through the read process in the patrol process is not output to the host device 2. That is, the patrol process differs from the host read process that outputs read data to the host device 2 in that data read from the NAND flash memory 10 is not output the host device 2.

The check patrol process has a function of checking whether an error contained in data read from a patrol target can be corrected. The update patrol process has a function of updating a read voltage used for reading data so as to reduce an error contained in data read from a patrol target. Details of the patrol process will be described later.

The patrol management information 21 includes information for managing schedules such as an execution range (physical address), type, frequency, priority, and the like, of a patrol process executed on the NAND flash memory 10. The patrol result information 22 includes a result of the patrol process, and for example includes information indicative of whether data stored in the physical address of the patrol target can be read with a small number of error bits, and whether data should be refreshed when the number of error bits is large. The patrol progress information 23 includes information indicative of a progress state of the patrol process, and for example includes information indicative of whether the patrol process is executed on the schedule stored in the patrol management information 21.

The memory controller 30 includes a processor (CPU) 31, a buffer memory 32, a host interface circuit 33, an ECC circuit 34, a NAND interface circuit 35, and a DRAM interface circuit 36. The function of each of units 31-36 of the memory controller 30 described below can be implemented by either a hardware configuration or a combined configuration of a hardware resource and firmware.

The processor 31 controls the operation of the entire memory controller 30 by loading the program stored in a read only memory (ROM). For example, upon receipt of a read request from the host device 2, the processor 31 executes, in response thereto, a read process. A similar process is performed for writing and erasing. Further, upon receipt of a patrol management information set request from the host device 2, the processor 31 generates, in response thereto, a schedule of the patrol process, and sets the schedule in the patrol management information 21. That is, the processor 31 executes the patrol process based on the schedule in accordance with the request from the host device 2.

The buffer memory 32 is, for example, a static random access memory (SRAM), and temporarily stores data read by the memory controller 30 from the NAND flash memory 10, write data received from the host device 2, etc.

The host interface circuit 33 is coupled to the host device 2 via a host bus, and manages communications between the memory controller 30 and the host device 2. The host bus is a bus compliant with, for example, an SD™ interface, serial attached small computer system interface (SCSI) (SAS), serial advanced technology attachment (ATA) (SATA), peripheral component interconnect express (PCIe™) or the like.

The ECC circuit 34 performs error detection and error correction processes on data stored in the NAND flash memory 10. Namely, the ECC circuit 34 generates an error correction code and provides write data with the error correction code when writing data, decodes the error correction code when reading data, and detects whether there is an error bit. When the error bit is detected, the location of the error bit is specified to correct the error. The method for error correction includes, for example, hard bit decoding and soft bit decoding.

As a hard bit decoding code used for the hard bit decoding, a Bose-Chaudhuri-Hocquenghem (BCH) code, a Reed-Solomon (RS) code, or the like can be used, while as a soft bit decoding code used for the soft bit decoding, a low density parity check (LDPC) code or the like can be used.

The NAND interface circuit 35 is coupled to the NAND flash memory 10 via the NAND buses, and controls communication with the NAND flash memory 10. The NAND interface circuit 35 may control transfer of the data, commands, and physical addresses between the memory controller 30 and the NAND flash memory 10, and independently control each of the chips 10-0 to 10-N in the NAND flash memory 10. The NAND interface circuit 35 compliant with the NAND interface standard.

The DRAM interface circuit 36 is coupled to the DRAM 20, and manages communications between the memory controller 30 and the DRAM 20. The DRAM interface circuit 36 compliant with the DRAM interface standard.

1.1.3 Chip

Figure 2:
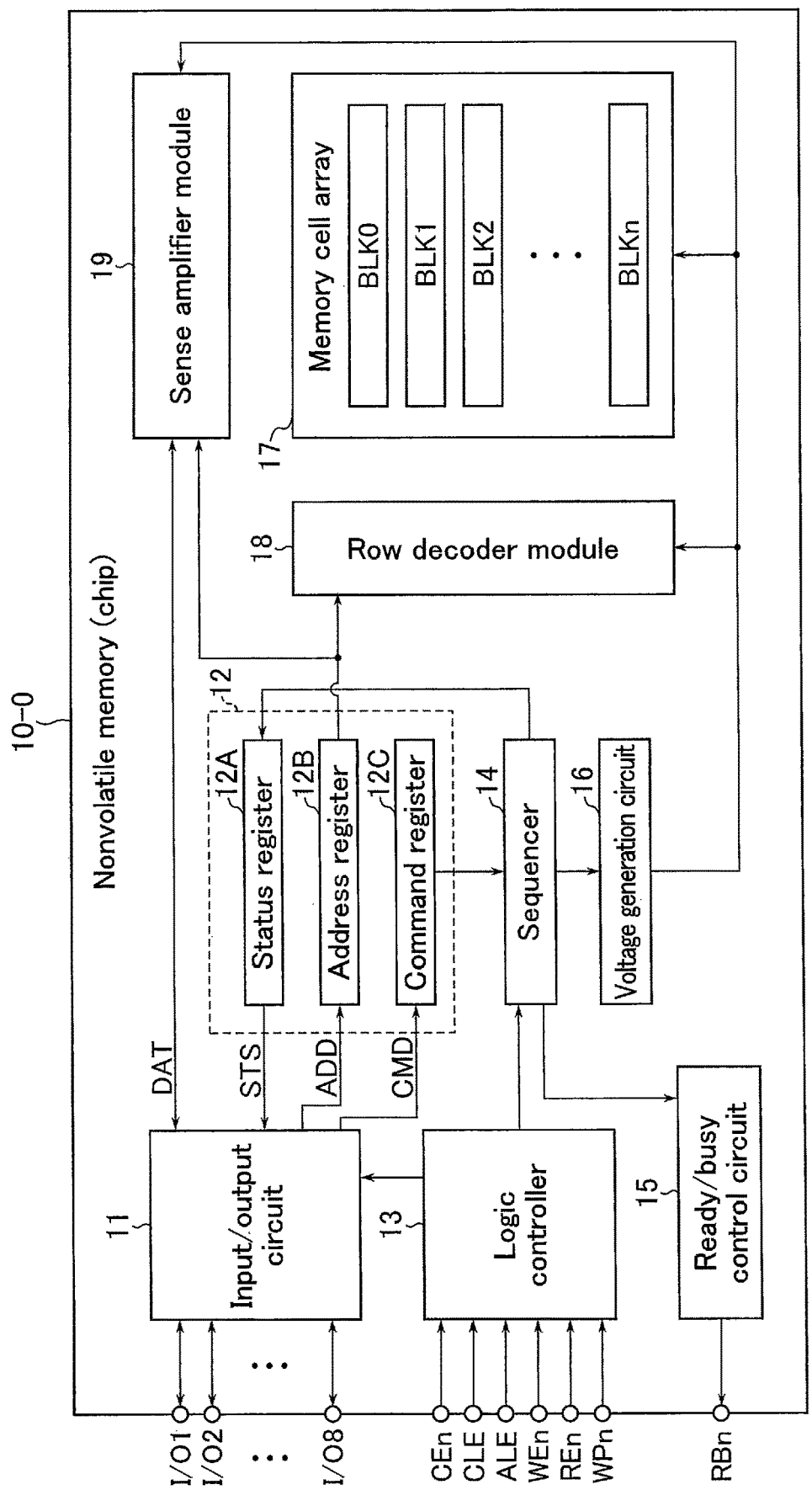
FIG. 2 is a block diagram for illustrating a configuration of a nonvolatile memory according to the first embodiment.

Next, with reference to FIG. 2, a configuration of the chip in the NAND flash memory 10 will be described. FIG. 2 illustrates an example of a configuration in the chip 10-0. The chips other than the chip 10-0 have a similar configuration to that of chip 10-0, descriptions of which will be omitted.

As illustrated in FIG. 2, the chip 10-0 includes, for example, an input/output circuit 11, a resister set 12, a logic controller 13, a sequencer 14, a ready/busy control circuit 15, a voltage generation circuit 16, a memory cell array 17, a row decoder module 18, and a sense amplifier module 19.

The input/output circuit 11 transmits and receives input/output signals I/O1 to I/O8 of 8-bit wide, for example, to and from the memory controller 30, for example. The input/output signal I/O may include data DAT, status information STS, physical address ADD, command CMD, and the like. The input/output circuit 11 transmits and receives data DAT to and from the sense amplifier module 19.

The register set 12 includes a status register 12A, an address register 12B, and a command register 12C. The status register 12A, the address register 12B, and the command register 12C store the status STS, physical address ADD, and command CMD, respectively.

The status STS is updated based on the operation state of the sequencer 14, for example. The status STS is transferred to the input/output circuit 11 from the status register 12A based on an instruction from the memory controller 30, and is output to the memory controller 30. The physical address ADD is transferred to the address resister 12B from the input/output circuit 11, and may include, for example, a chip address, a block address, a page address, a column address, and the like. The command CMD is transferred to the command resister 12C from the input/output circuit 11, and includes commands for various operations of the chip 10-0.

The logic controller 13 controls the input/output circuit 11 and the sequencer 14 on the basis of the control signals received from the memory controller 30. Such various control signals include, for example, a chip enable signal CEn, a command latch enable signal CLE, an address latch enable signal ALE, a write enable signal WEn, a read enable signal REn, and a write protect signal WPn.

The chip enable signal CEn is a signal to enable the chip 10-0. The command latch enable signal CLE is a signal for notifying the input/output circuit 11 that the received input/output signal I/O is a command CMD. The address latch enable signal ALE is a signal for notifying the input/output circuit 11 that the received input/output signal I/O is address information ADD. The write enable signal WEn is a signal for instructing the input/output circuit 11 to input the input/output signal I/O. The read enable signal REn is a signal for instructing the input/output circuit 11 to output the input/output signal I/O. The write protect signal WPn is a signal for placing the chip 10-0 in a protected state when turning on or off the power.

The sequencer 14 controls the operation of the entire chip 10-0. For example, the sequencer 14 executes a read process, write process, erase process, etc., based on the command CMD stored in the command resister 12C, and the physical address ADD stored in the address resister 12B.

The ready/busy control circuit 15 generates ready/busy signal RBn based on the operation state of the sequencer 14. The ready/busy signal RBn is a signal for notifying the memory controller 30 of whether the chip 10-0 is in a ready state or in a busy state. In this specification, the "ready state" indicates a state where the chip 10-0 accepts instructions from the memory controller, while the "busy state" indicates a state where the chip 10-0 does not accept instructions from the memory controller.

The voltage generation circuit 16 generates voltages used for the read process, write process, erase process, etc. The voltage generation circuit 16 supplies the generated voltages to the memory cell array 17, the row decoder module 18, and the sense amplifier module 19.

The memory cell array 17 includes a plurality of blocks BLK0 to BLKn (where n is an integer equal to or greater than 1). The block BLK is a set of memory cell transistors capable of storing data in a nonvolatile manner, and is used as, for example, a unit of erasing data. Each memory cell transistor is associated with one bit line BL and one word line WL.

The row decoder module 18 selects a target block BLK, on which various operations are executed, based on a block address. The row decoder module 18 transfers a voltage supplied from the voltage generation circuit 16 to the word line WL or the like in the selected block BLK.

The sense amplifier module 19 reads, in the read process, data from the memory cell array 17, and transfers the read data to the input/output circuit 11. The sense amplifier module 19 applies, in the write process, a predetermined voltage to bit line BL based on the data received from the input/output circuit 11.

1.1.4 Memory Cell Array

FIG. 3 illustrates an example of a circuit configuration of a memory cell array included in the chip inside the nonvolatile memory according to the first embodiment, by extracting one block BLK. As shown in FIG. 3, a block BLK includes, for example, four string units SU0 to SU3.

Each string unit SU includes a plurality of NAND strings NS that are respectively associated with bit lines BL0 to BLm (where m is an integer greater than or equal to 1). Each NAND string NS includes, for example, memory cell transistors MT0 to MT7 and select transistors ST1 and ST2.

Each memory cell transistor MT includes a control gate and a charge accumulation layer, and stores data in a nonvolatile manner. Each of the select transistors ST1 and ST2 is used to select a string unit SU at the time of performing various processes.

In each NAND string NS, the memory cell transistors MT0 to MT7 are coupled in series. The select transistor ST1 is coupled between one end of the series of the memory cell transistors MT0 to MT7 and the associated bit line BL. The other end of the series of the memory cell transistors MT0 to MT7 is coupled to the drain of select transistor ST2. A source of the select transistor ST2 is coupled to a source line CELSRC.

The gates of select transistors ST1 respectively included in string units SU0 to SU3 in the same block BLK are respectively coupled to select gate lines SGD0 to SGD3. The control gates of the memory cell transistors MT0 to MT7 are coupled in common to word lines WL0 to WL7, respectively. Gates of the select transistors ST2 are commonly coupled to the select gate line SGS.

The bit lines BL0 to BLm are shared by a plurality of blocks BLK. The NAND strings NS corresponding to the same column address are coupled to the same bit line BL. A set of word lines WL0 to WL7 is provided for each block BLK. The source line CELSRC is, for example, shared by a plurality of blocks BLK.

A set of memory cell transistors MT coupled to a common word line WL in one string unit SU is referred to as, for example, a cell unit CU. For example, the storage capacity of the cell unit CU including memory cell transistors MT configured to store 1-bit data is defined as "1-page data". A cell unit CU may have a storage capacity of 2 or more pages of data, according to the number of bits of data stored in the memory cell transistor MT.

In the present embodiment, one memory cell transistor MT can store 4-bit data. Namely, the memory cell transistor MT in the present embodiment is a quad level cell (QLC) storing 4-bit data. The bits of 4-bit data stored in the quad level cell (QLC) memory cell transistors are called a lower bit, a middle bit, an upper bit, and a top bit from the low-order bit. A set of lower bits stored in memory cell transistors MT included in the same cell unit CU is called a "lower page", a set of middle bits is called a "middle page", a set of upper bits is called an "upper page", and a set of top bits is called a "top page".

The above-described circuit configuration of the memory cell array 17 is merely an example, and the configuration is not limited thereto. For example, the number of string units SU included in each block BLK may be determined as appropriate. The number of memory cell transistors MT or select transistors ST1 and ST2 included in each NAND string NS may be determined as appropriate.

The circuit configuration of the memory cell array 17 may vary among the chips 10-0 to 10-N. Specifically, for example, in the chips 10-0 to 10-N, the number of blocks BLK, the number of string units SU, the number of word lines WL, the number of bit lines BL, and the like may vary according to device IDs of the chips 10-0 to 10-N.

1.1.5 Threshold Voltage Distributions of Memory Cell Transistors

Figure 4:
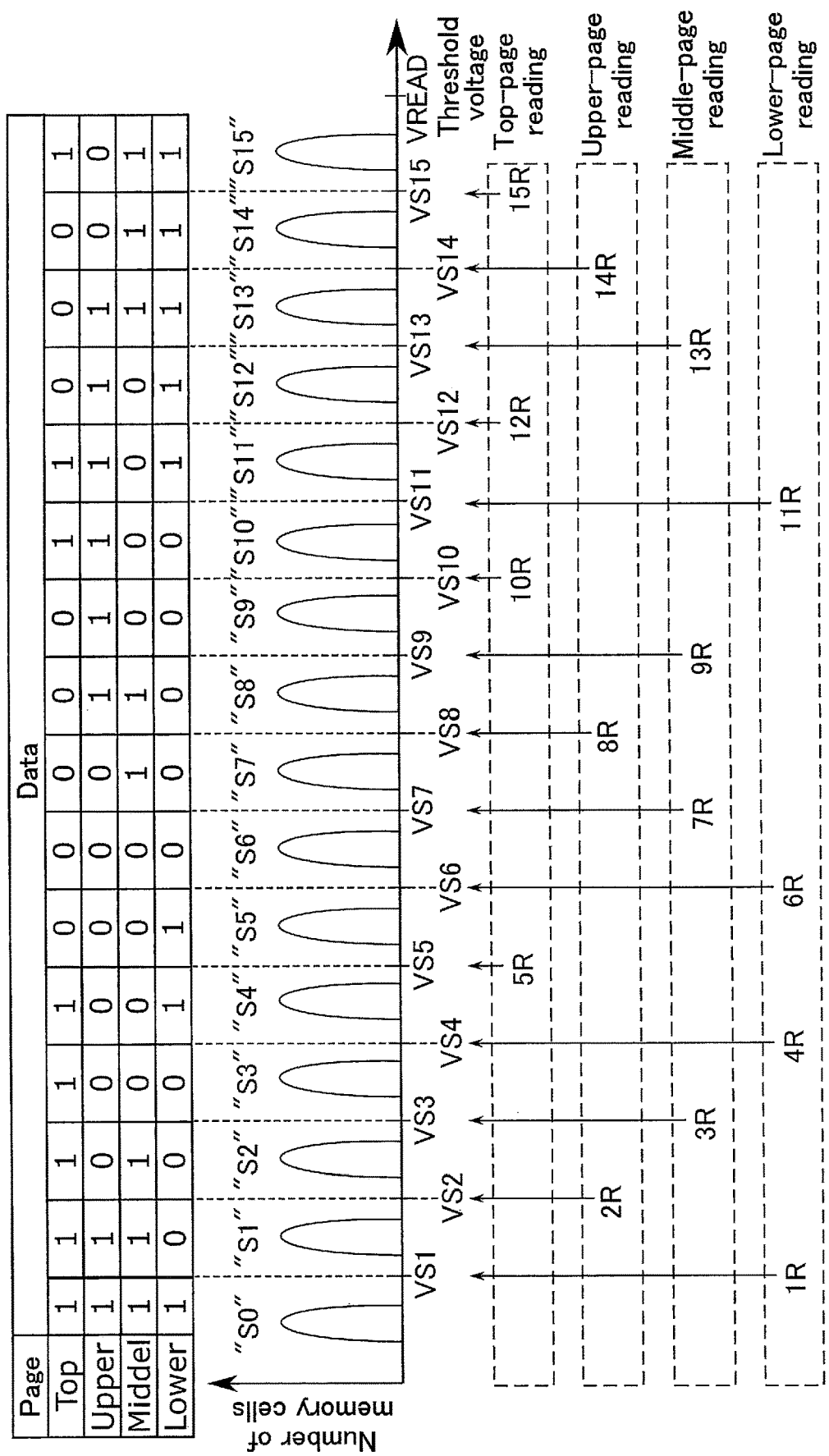
FIG. 4 is a schematic diagram for illustrating threshold voltage distributions of the memory cell array according to the first embodiment.

Next, with reference to FIG. 4, threshold voltage distributions of the memory cell transistors MT will be described. FIG. 4 shows storable data, threshold voltage distributions, and voltages used in read process, for the memory cell transistors MT in the memory cell array 17.

As shown in FIG. 4, when the memory cell transistor MT stores 4-bit data, the threshold voltage distribution thereof can be divided into sixteen. These sixteen threshold voltage distributions are called, in order from the lower threshold voltage, "S0" state, "S1" state, "S2" state, "S3" state, "S4" state, "S5" state, "S6" state, "S7" state, "S8" state, "S9" state, "S10" state, "S11" state, "S12" state, "S13" state, "S14" state, and "S15" state.

In FIG. 4, voltages VS1, VS2, VS3, VS4, VS5, VS6, VS7, VS8, VS9, VS10, VS11, VS12, VS13, VS14, and VS15 are each used to distinguish between the adjacent two states when the read process is performed. Voltage VREAD is a voltage applied to non-selected word lines in the read process. When the voltage VREAD is applied to a gate, a memory cell transistor MT is set to an ON state regardless of data stored therein. These voltage values have the relation of VS1<VS2<VS3<VS4<VS5<VS6<VS7<VS8<VS9<VS10<VS11<VS12<VS13<VS14<VS15<VREAD.

The "S0" state of the above-described threshold voltage distributions corresponds to an erase state of the memory cell transistors MT. The threshold voltage belonging to the "S0" state is lower than voltage VS1. The threshold voltage belonging to the "S1" state is equal to or higher than voltage VS1 and lower than voltage VS2. The threshold voltage belonging to the "S2" state is equal to or higher than voltage VS2 and lower than voltage VS3. The threshold voltage belonging to the "S3" state is equal to or higher than voltage VS3 and lower than voltage VS4. The threshold voltage belonging to the "S4" state is equal to or higher than voltage VS4 and lower than voltage VS5. The threshold voltage belonging to the "S5" state is equal to or higher than voltage VS5 and lower than voltage VS6. The threshold voltage belonging to the "S6" state is equal to or higher than voltage VS6 and lower than voltage VS7. The threshold voltage belonging to the "S7" state is equal to or higher than voltage VS7 and lower than voltage VS8. The threshold voltage belonging to the "S8" state is equal to or higher than voltage VS8 and lower than voltage VS9. The threshold voltage belonging to the "S9" state is equal to or higher than voltage VS9 and lower than voltage VS10. The threshold voltage belonging to the "S10" state is equal to or higher than voltage VS10 and lower than voltage VS11. The threshold voltage belonging to the "S11" state is equal to or higher than voltage VS11 and lower than voltage VS12. The threshold voltage belonging to the "S12" state is equal to or higher than voltage VS12 and lower than voltage VS13. The threshold voltage belonging to the "S13" state is equal to or higher than voltage VS13 and lower than voltage VS14. The threshold voltage belonging to the "S14" state is equal to or higher than voltage VS14 and lower than voltage VS15. The threshold voltage belonging to the "S15" state is equal to or higher than voltage VS15 and lower than voltage VREAD.

The above-described sixteen threshold voltage distributions are formed by writing 4-bit (4-page) data including lower bit, middle bit, upper bit, and top bit. The sixteen threshold voltage distributions correspond to different respective 4-bit data. In the present embodiment, data is allocated to the memory cell transistors MT included in each state as "top bit/upper bit/middle bit/lower bit" as indicated below.

The memory cell transistor MT included in the "S0" state stores "1111" data. The memory cell transistor MT included in the "S1" state stores "1110" data. The memory cell transistor MT included in the "S2" state stores "1010" data. The memory cell transistor MT included in the "S3" state stores "1000" data. The memory cell transistor MT included in the "S4" state stores "1001" data. The memory cell transistor MT included in the "S5" state stores "0001" data. The memory cell transistor MT included in the "S6" state stores "0000" data. The memory cell transistor MT included in the "S7" state stores "0010" data. The memory cell transistor MT included in the "S8" state stores "0110" data. The memory cell transistor MT included in the "S9" state stores "0100" data. The memory cell transistor MT included in the "S10" state stores "1100" data. The memory cell transistor MT included in the "S11" state stores "1101" data. The memory cell transistor MT included in the "S12" state stores "0101" data. The memory cell transistor MT included in the "S13" state stores "0111" data. The memory cell transistor MT included in the "S14" state stores "0011" data. The memory cell transistor MT included in the "S15" state stores "1011" data.

Lower-page reading uses, as read voltages, voltage VS1 which distinguishes between the "S0" state and the "S1" state, voltage VS4 which distinguishes between the "S3" state and the "S4" state, voltage VS6 which distinguishes between the "S5" state and the "S6" state, and voltage VS11 which distinguishes between the "S10" state and the "S11" state. The read processes using the voltages VS1, VS4, VS6 and VS11 will be referred to as read processes 1R, 4R, 6R, and 11R, respectively.

Middle-page reading uses, as read voltages, voltage VS3 which distinguishes between the "S2" state and the "S3" state, voltage VS7 which distinguishes between the "S6" state and the "S7" state, voltage VS9 which distinguishes between the "S8" state and the "S9" state, and voltage VS13 which distinguishes between the "S12" state and the "S13" state. The read processes using the voltages VS3, VS7, VS9 and VS13 will be referred to as read processes 3R, 7R, 9R, and 13R, respectively.

Upper-page reading uses, as read voltages, voltage VS2 which distinguishes between the "S1" state and the "S2" state, voltage VS8 which distinguishes between the "S7" state and the "S8" state, and voltage VS14 which distinguishes between the "S13" state and the "S14" state. The read processes using the voltages VS2, VS8, and VS14 will be referred to as read processes 2R, 8R, and 14R, respectively.

Top-page reading uses, as read voltages, voltage VS5 which distinguishes between the "S4" state and the "S5" state, voltage VS10 which distinguishes between the "S9" state and the "S10" state, voltage VS12 which distinguishes between the "S11" state and the "S12" state, and voltage VS15 which distinguishes between the "S14" state and the "S15" state. The read processes using the voltages VS5, VS10, VS12 and VS15 will be referred to as read processes 5R, 10R, 12R, and 15R, respectively.

The above-described data allocation is an example, and other data allocations may be employed.

1.1.6 Patrol Management Information

Next, a configuration of patrol management information according to the first embodiment will be described. FIG. 5 is a conceptual diagram for illustrating an example of a configuration of patrol management information according to the first embodiment. FIGS. 6 and 7 are conceptual diagrams for illustrating details of the patrol management information according to the first embodiment. FIG. 6 shows an example of a physical address included in the patrol management information. FIG. 7(A), FIG. 7(B), FIG. 7(C), and FIG. 7(D) show examples of priority, type, period, and management flag, respectively, included in the patrol management information.

In the following description, while the concept of the patrol management information 21 is described with FIG. 5, detailed information items of various elements will be described with reference to FIG. 6 or FIG. 7 as appropriate.

As shown in FIG. 5, the patrol management information 21 may have a plurality of queues respectively associated with different priories. In the example of FIG. 5, in a queue corresponding to a given priority, a plurality of patrol specification units PU associated with the given priority are aligned in order of execution. Specifically, a set of patrol specification units PU00, PU01, PU02 . . . PU0$x$, a set of PU10, PU11, PU12 . . . PU1$x$, and a set of PU20, PU21, PU22 . . . PU2$x$ are managed by queues associated with three different priorities.

Each of the patrol specification units PU is a patrol process executing unit, and includes information on, for example, <physical address>, <priority>, <type>, <period>, and <management flag>.

First, physical address ADD in the patrol specification unit PU will be described with reference to FIG. 6. The physical address ADD specifies a memory region in the NAND flash memory 10 subjected to the patrol process corresponding to the patrol specification unit PU.

As shown in FIG. 6, the physical address ADD specifies a range of the physical address of the patrol target, and an element subjected to the patrol in the range. More specifically, the physical address ADD specifies, as a range, chip Chip, block BLK, word line WL, string unit SU, and page P in the NAND flash memory 10. For example, if all pages P of memory cell transistors MT corresponding to all word lines WL and all string units SU in all blocks BLK in all chips Chip are specified, the physical address ADD is <allChip-allBLK-allWL-allSU-allP>. Furthermore, for example, if page PX$p$ of memory cell transistors MT corresponding to word line WLX$w$ and string unit SUX$s$ in block BLKX$b$ in chip ChipX$c$ is specified, the physical address ADD is <ChipX$c$-BLKX$b$-WLX$w$-SUX$s$-PX$p$> (where X$c$ is an integer equal to or greater than 0 and equal to or less than N, X$b$ is an integer equal to or greater than 0 and equal to or less than n, X$w$ is an integer equal to or greater than 0 and equal to or less than 7, X$s$ is an integer equal to or greater than 0 and equal to or less than 3, and X$p$ is an integer equal to or greater than 0 and equal to or less than 3). FIG. 6 shows an example in which X$p$ is a lower page when "0", a middle page when "1", an upper page when "2", and a top page when "3".

Next, priority Pr in the patrol specification unit PU will be described with reference to FIG. 7(A). The priority Pr specifies a priority order of the patrol process with respect to processes other than the patrol process scheduled to be executed in the memory controller 30.

As shown in FIG. 7(A), priority Pr <Pr0> indicates that the patrol process corresponding to the patrol specification unit PU is executed with the highest priority. Priority Pr <Pr1> indicates that the priority order of the corresponding patrol process is set to be the next highest after the host read process, and this patrol process is executed with priority after the host read process. Priority Pr <Pr2> indicates that the priority order of the corresponding patrol process is set to be low with respect to all other processes, and this patrol process is executed at the end. Priority Pr <Pr3> indicates that the corresponding patrol process is executed after the request from the host device 2 (host command) is processed predetermined times.

Next, type W in the patrol specification unit PU will be described with reference to FIG. 7(B). The type W specifies a type of the patrol process corresponding to the patrol specification unit PU.

As shown in FIG. 7(B), type W <WCheck> indicates that the check patrol process is applied to the patrol process corresponding to the patrol specification unit PU. The type W <WUpdate> indicates that the update patrol process is applied to the patrol process.

Next, period Pe in the patrol specification unit PU will be described with reference to FIG. 7(C). The period Pe indicates the frequency in which the patrol process corresponding to the patrol specification unit PU is set in the patrol management information 21.

As shown in FIG. 7(C), periods Pe <Pe12H>, <Pe1D>, <Pe2D>, <Pe4D>, and <Pe8D> indicate that the patrol process corresponding to the patrol specification unit PU is executed every 12 hours, 1 day, 2 days, 4 days, and 8 days, respectively. Thus, after the corresponding patrol process is executed, the patrol specification unit PU for which the period Pe is set is reset as new patrol specification unit PU at a position that is behind, by period Pe, the time point at which the patrol specification unit PU was executed in terms of time series.

Although illustration is omitted in FIG. 7(C), when <Pe2D>, <Pe4D> and <Pe8D> are set, the period Pe may include information further specifying on what date of the periods Pe the corresponding patrol process is executed. Specifically, for example, when the periods Pe are <Pe4D-1>, <Pe4D-2>, <Pe4D-3>, and <Pe4D-0>, the corresponding patrol process may be set to be executed on day 1, day 2, day 3, and day 4, respectively, of the four-day period.

Next, management flag F in the patrol specification unit PU will be described with reference to FIG. 7(D). The management flag F indicates a flag specially given to the patrol process corresponding to the patrol specification unit PU.

As shown in FIG. 7(D), management flag F <FReset> indicates that the flag given to the patrol process corresponding to the patrol specification unit PU is in a reset state (flag not given). The management flag F <FPatrol> indicates that the patrol process corresponding to the patrol specification unit PU is forcibly executed.

With the patrol management information 21 as described above, the memory controller 30 can manage the schedule of the patrol process executed on the NAND flash memory 10.

In the example of FIG. 5, multiple patrol specification units PU are managed by the queues of differing priorities, but the present invention is not limited thereto. For example, multiple patrol specification units PU may be managed by a single queue in a collective manner.

1.1.7 Patrol Result Information

Next, a configuration of patrol result information according to the first embodiment will be described. FIG. 8 is a conceptual diagram for illustrating an example of a configuration of patrol result information according to the first embodiment.

As shown in FIG. 8, the patrol result information 22 stores a refresh flag indicating on which block BLK the refresh process should be executed for each of all chips 10-0 to 10-N in the NAND flash memory 10. The refresh process is a process for reducing the number of error bits contained in data by rewriting data written in the NAND flash memory 10 on a new physical address, or overwriting on the physical address on which the data is written.

In the example of FIG. 8, the refresh flag of the block BLK0 of the chip 10-0 is "True", and information that the refresh process should be executed is stored. The refresh flags of the blocks BLK other than the block BLK0 of chip 10-0 are "False", and information that the refresh process may not be executed is stored.

For example, if the result of the patrol process shows that the number of error bits contained in data read from the patrol target is larger than a threshold, "True" is stored for the refresh flag corresponding to block BLK including the patrol target in the patrol result information 22. Therefore, the memory controller 30 can be aware of whether the refresh process is necessary by referring to the patrol result information 22.

1.1.8 Patrol Progress Information

Next, a configuration of patrol progress information according to the first embodiment will be described. FIG. 9 is a conceptual diagram for illustrating an example of a configuration of patrol progress information according to the first embodiment.

As shown in FIG. 9, the patrol progress information 23 stores a patrol specification unit PU that have not been processed yet due to the priority with respect to other processes such as the host command when the patrol process proceeded in accordance with the patrol management information 21. As described above, for the patrol specification units PU, different priorities Pr are set depending on the situations. Accordingly, if the priority Pr is not set to the highest priority (not <Pr0>), execution of this patrol specification unit PU may be prevented by other processes such as a host read process. The memory controller 30 can understand such delay in patrol process progress by referring to the patrol progress information 23.

Further, the patrol progress information 23 may also store the number of patrol specification units PU that have not been processed for each queue, in addition to store only the patrol specification units PU that have not been processed as described above. This allows the memory controller 30 to easily understand the extent to which the patrol process is delayed for each queue.

1.2 Operation

Next, an operation in the information processing system according to the first embodiment will be described.

1.2.1 Flowchart of Patrol Management Information Setting Operation

First, a description will be given of a patrol management information setting operation in the information processing system according to the first embodiment.

FIG. 10 is a flowchart illustrating a patrol management information setting operation in the information processing system according to the first embodiment. FIG. 10 shows some of the setting operations of the patrol management information 21 based on the request from the host device 2.

FIG. 10 indicates that the processes of the memory system 3 in steps ST3, ST5, ST7, ST9, ST11, ST13, and ST15 are executed according to the requests from the host device 2 in steps ST2, ST4, ST6, ST8, ST10, ST12, and ST14, respectively, but does not indicate that the requests from the host device 2 in steps ST2, ST4, ST6, ST8, ST10, ST12, and ST14 are executed in this order.

As shown in FIG. 10, in step ST1, the memory system 3 is activated. Upon activation of the memory system 3, the processor 31 loads the program stored in the ROM (power-on read process), and starts control of the memory controller 30. Immediately after the power-on read process, the patrol management information 21 may not be stored in the DRAM 20. Therefore, the memory controller 30 may not have a schedule for executing the patrol process immediately after the power-on read process.

In step ST2, the host device 2 issues patrol mode registration request "SetPatCom", and transmits it to the memory system 3. The patrol mode is defined as a format of multiple patrol processes that are set for a given physical address range (e.g., a range of one block BLK). The patrol mode registration request "SetPatCom" is a command for notifying the memory system 3 of the patrol mode defined in advance by the host device 2.

In step ST3, upon receipt of the patrol mode registration request, the memory controller 30 registers the patrol mode. Using the patrol mode, the memory controller 30 can efficiently set multiple patrol specification units PU in the patrol management information 21 with a lower number of commands.

In step ST4, the host device 2 issues patrol management information set request "PatrolSet" for a memory region in which data is already written (data-written region) in the NAND flash memory 10, and transmits it to the memory controller 30. The patrol management information set request "PatrolSet" is a command for instructing the memory controller 30 to set one or a plurality of patrol specification units PU in the patrol management information 21. The patrol management information set request "PatrolSet" in step ST4 includes physical address ADD that specifies the data-written region.

In step ST5, upon receipt of the patrol management information set request, the memory controller 30 sets the patrol process to be executed on the data-written region in the patrol management information 21. Thereby, the patrol management information 21 is initialized, and the memory controller 30 can execute the patrol process according to the schedule.

In step ST6, the host device 2 issues write request "Write", and transmits it to the memory controller 30. The write request "Write" includes data written into the NAND flash memory 10, and physical address (write target region) ADD in the NAND flash memory 10 into which the data is to be written.

In step ST7, the memory controller 30 writes data in the NAND flash memory 10 based on the write request.

In step ST8, the host device 2 issues patrol management information set request "PatrolSet" for the write target region, and transmits it to the memory controller 30. The patrol management information set request "PatrolSet" in step ST8 includes physical address ADD specifying the same memory region as the write target region.

In step ST9, upon receipt of the patrol management information set request, the memory controller 30 sets the patrol process to be executed on the write target region in the patrol management information 21. Thereby, the patrol process corresponding to the data newly written by the write process in step ST7 is added to the patrol management information 21. With the patrol management information set request transmitted with the write request, the memory controller 30 can set the schedule of the patrol process also on the memory region as a new data-written region after activation of the memory system 3.

In step ST10, the host device 2 issues new patrol management information set request "PatrolSet" for the data-written region, and transmits it to the memory controller 30.

In step ST11, upon receipt of the new patrol management information set request, the memory controller 30 sets new patrol process to be executed on the data-written region in the patrol management information 21. Thus, the patrol management information 21 is updated by the new patrol management information set request. In this manner, with the latest patrol management information set request, the memory controller 30 can update the schedule of the patrol process to be executed.

In step ST12, the host device 2 issues an erase or invalidate request, and transmits it to the memory controller 30. The erase or invalidate request includes physical address (erase or invalidate target region) ADD in the NAND flash memory 10 in which data as an erase or invalidate target is stored.

In step ST13, the memory controller 30 erases or invalidates data in the NAND flash memory 10 based on the erase or invalidate request.

In step ST14, the host device 2 issues patrol management information delete request "PatrolUnSet" for the erase or invalidate target region, and transmits it to the memory controller 30. The patrol management information delete request "PatrolUnSet" is a command for instructing the memory controller 30 to delete one or a plurality of patrol specification units PU from the patrol management information 21. The patrol management information delete request "PatrolUnSet" includes physical address ADD specifying the erase or invalidate target region.

In step ST15, upon receipt of the patrol management information delete request, the memory controller 30 deletes the schedule of the patrol process on the erase or invalidate target region from the patrol management information 21. With the patrol management information delete request, the memory controller 30 can delete a schedule of an unnecessary patrol process as appropriate, and solely execute a necessary patrol process in a selective manner.

This ends the patrol management information setting operation. It should be noted that the processes in steps ST6 to ST15 of FIG. 10 of adding and changing the patrol management information 21 involved with the write process and deleting the patrol management information 21 involved with the erase or invalidate process are executed in random order at a discretionary timing during system operation, not limited to immediately after the memory system 3 is activated. Thereby, the patrol management information 21 can be kept up to date over a period of time in which the memory system 3 is activated.

1.2.2 Patrol Mode Registration Operation

Next, some examples of the patrol mode registration operation in the information processing system according to the first embodiment will be described. As described below, the memory controller 30 specifies physical address ADD, priority Pr, type W, period Pe, and management flag F based on the command from the host device 2, thereby setting the schedule of the patrol process.

1.2.2.1 First Example (Patrol Mode A)

First, a first example of the patrol mode will be described. In the first example, in one block BLK range, four kinds of check patrol process are set exhaustively in which the period is equal but the execution date differs for each other.

Figure 11:
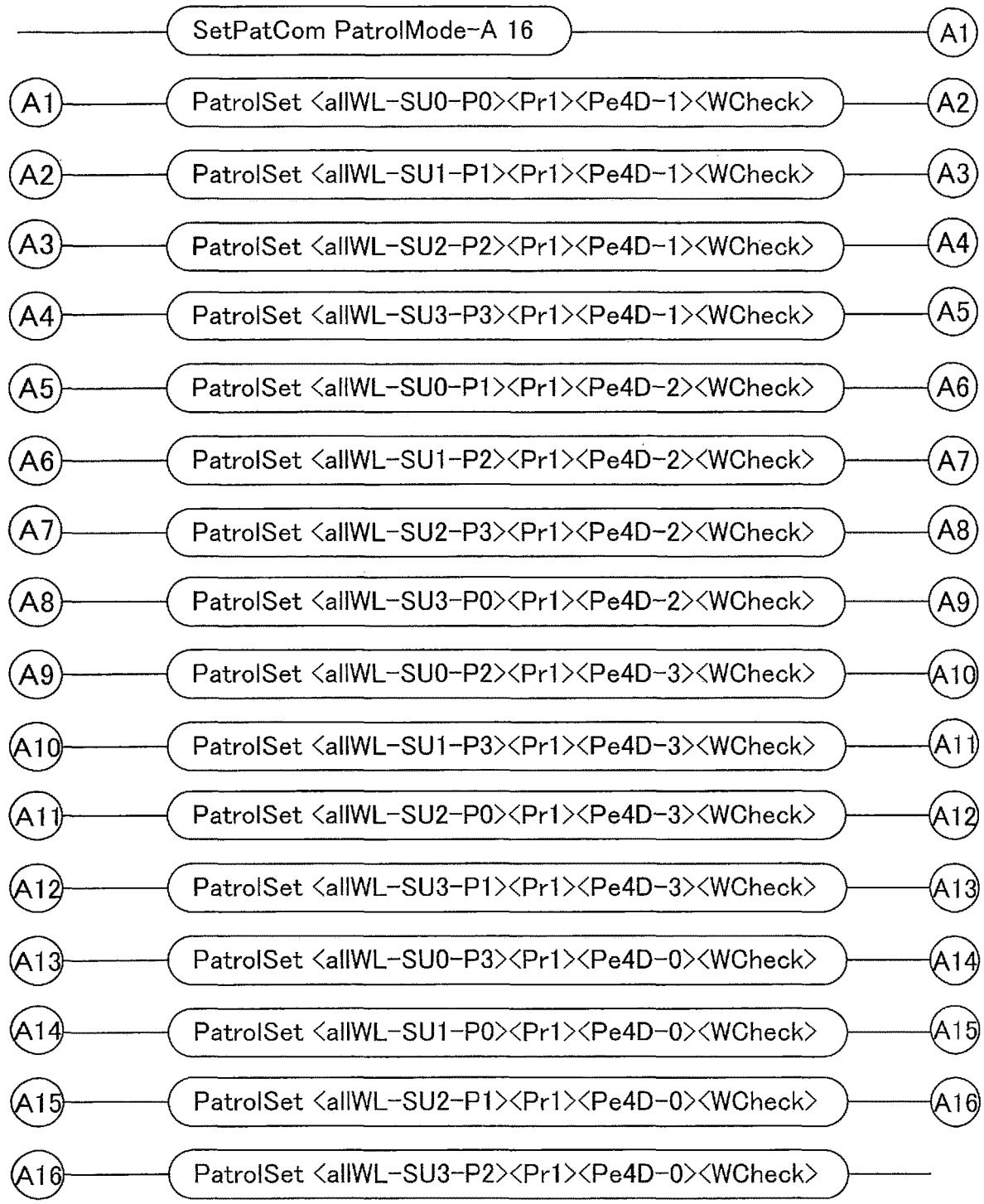
FIG. 11 is a command sequence for illustrating a registration operation of a first example of a patrol mode in the information processing system according to the first embodiment.
Figure 12:
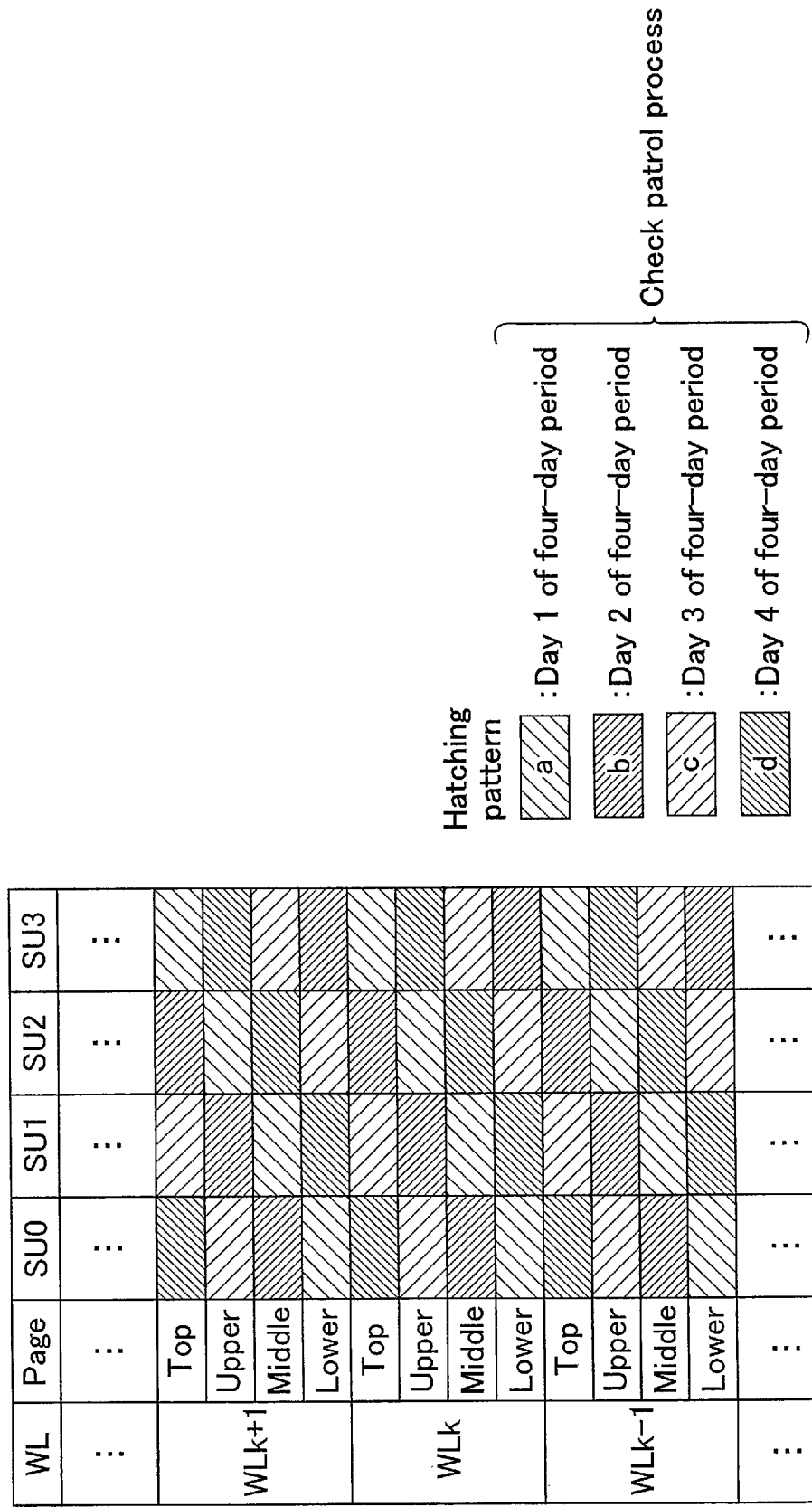
FIG. 12 is a schematic diagram for illustrating the first example of the patrol mode registered in the information processing system according to the first embodiment.

FIG. 11 is a command sequence illustrating a registration operation of the first example of the patrol mode in the information processing system according to the first embodiment. FIG. 12 is a schematic view illustrating the first example of the patrol mode registered in the information processing system according to the first embodiment. FIG. 11 shows a concrete example of a command set from the host device 2 for registering the first example of the patrol mode. In FIG. 12, four kinds of check patrol process that are set according to the command sequence of FIG. 11 are visually differentiated using four hatching patterns (a) to (d).

As shown on the first line of FIG. 11, the host device 2 issues patrol mode registration command "SetPatCom PatrolMode-A 16". Upon receipt of the command, the memory controller 30 recognizes that a group of patrol processes represented by a set of subsequent sixteen commands is defined as patrol mode A.

Next, as shown on the second to fifth lines of FIG. 11, the host device 2 issues four patrol management information set commands, "PatrolSet<allWL-SU0-P0><Pr1><Pe4D-1><WCheck>", "PatrolSet<allWL-SU1-P1><Pr1><Pe4D-1><WCheck>", "PatrolSet<allWL-SU2-P2><Pr1><Pe4D-1><WCheck>", and "PatrolSet<allWL-SU3-P3><Pr1><Pe4D-1><WCheck>". Upon receipt of the commands, the memory controller 30 recognizes that the patrol mode A includes check patrol processes that target lower pages of string unit SU0, middle pages of string unit SU1, upper pages of string unit SU2, and top pages of string unit SU3 in all word lines WL of a block BLK of a patrol mode registration target, in which the check patrol processes are executed on day 1 of the four-day period and have the next highest priority after the host read process. The above-described commands at the second to fifth lines of FIG. 11 correspond to hatching pattern (a) of FIG. 12.

Next, as shown on the sixth to ninth lines of FIG. 11, the host device 2 issues four patrol management information set commands, "PatrolSet<allWL-SU0-P1><Pr1><Pe4D-2><WCheck>", "PatrolSet<allWL-SU1-P2><Pr1><Pe4D-2><WCheck>", "PatrolSet<allWL-SU2-P3><Pr1><Pe4D-2><WCheck>", and "PatrolSet<allWL-SU3-P0><Pr1><Pe4D-2><WCheck>". Upon receipt of the commands, the memory controller 30 recognizes that the patrol mode A includes check patrol processes that target middle pages of string unit SU0, upper pages of string unit SU1, top pages of string unit SU2, and lower pages of string unit SU3 in all word lines WL of the block BLK of the patrol mode registration target, in which the check patrol processes are executed on day 2 of the four-day period and have the next highest priority after the host read process. The above-described commands at the sixth to ninth lines of FIG. 11 correspond to hatching pattern (b) of FIG. 12.

Next, as shown on the tenth to thirteenth lines of FIG. 11, the host device 2 issues four patrol management information set commands, "PatrolSet<allWL-SU0-P2><Pr1><Pe4D-3><WCheck>", "PatrolSet<allWL-SU1-P3><Pr1><Pe4D-3><WCheck>", "PatrolSet<allWL-SU2-P0><Pr1><Pe4D-3><WCheck>", and "PatrolSet<allWL-SU3-P1><Pr1><Pe4D-3><WCheck>". Upon receipt of the commands, the memory controller 30 recognizes that the patrol mode A includes check patrol processes that target upper pages of string unit SU0, top pages of string unit SU1, lower pages of string unit SU2, and middle pages of string unit SU3 in all word lines WL in the block BLK of the patrol mode registration target, in which the check patrol processes are executed on day 3 of the four-day period and have the next highest priority after the host read process. The above-described commands at the tenth to thirteenth lines of FIG. 11 correspond to hatching pattern (c) of FIG. 12.

Next, as shown on the fourteenth to seventeenth lines of FIG. 11, the host device 2 issues four patrol management information set commands, "PatrolSet<allWL-SU0-P3><Pr1><Pe4D-0><WCheck>", "PatrolSet<allWL-SU1-P0><Pr1><Pe4D-0><WCheck>", "PatrolSet<allWL-SU2-P1><Pr1><Pe4D-0><WCheck>", and "PatrolSet<allWL-SU3-P2><Pr1><Pe4D-0><WCheck>". Upon receipt of the commands, the memory controller 30 recognizes that the patrol mode A includes check patrol processes that target top pages of string unit SU0, lower pages of string unit SU1, middle pages of string unit SU2, and upper pages of string unit SU3 in all word lines WL in the block BLK of the patrol mode registration target, in which the check patrol processes are executed on day 4 of the four-day period and have the next highest priority after the host read process. The above-described commands at the fourteenth to seventeenth lines of FIG. 11 correspond to hatching pattern (d) of FIG. 12.

In this manner, the memory controller 30 can register the first example of the patrol mode as in FIG. 12.

1.2.2.2 Second Example (Patrol Mode B)

Next, a second example of the patrol mode will be described. In the second example, in one block BLK range, four kinds of check patrol process in which the period is equal but the execution date differs for each other, and the update patrol process that is set with higher frequency than the check patrol process, are set in a scattered manner.

Figure 13:
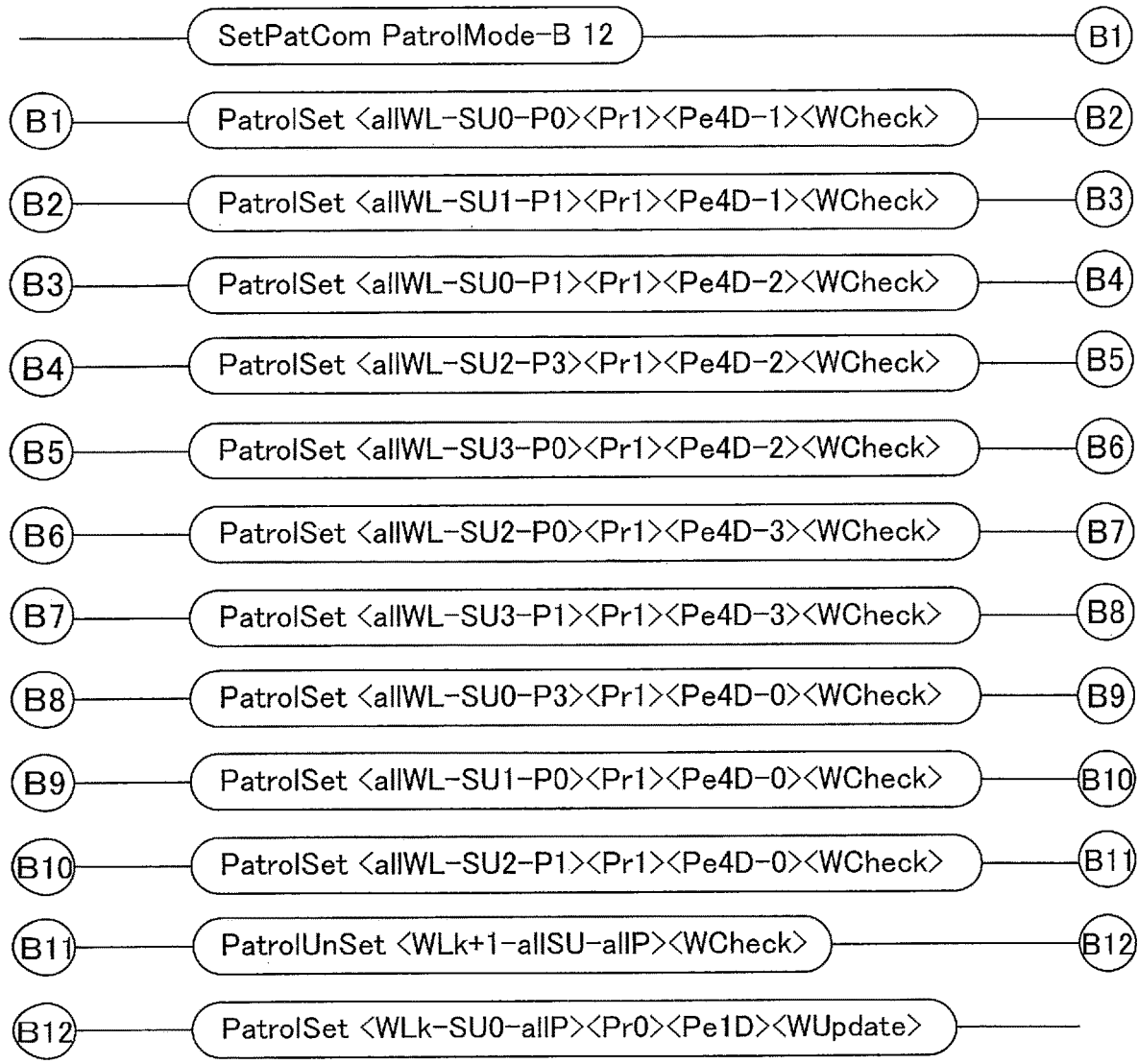
FIG. 13 is a command sequence for illustrating a registration operation of a second example of the patrol mode in the information processing system according to the first embodiment.
Figure 14:
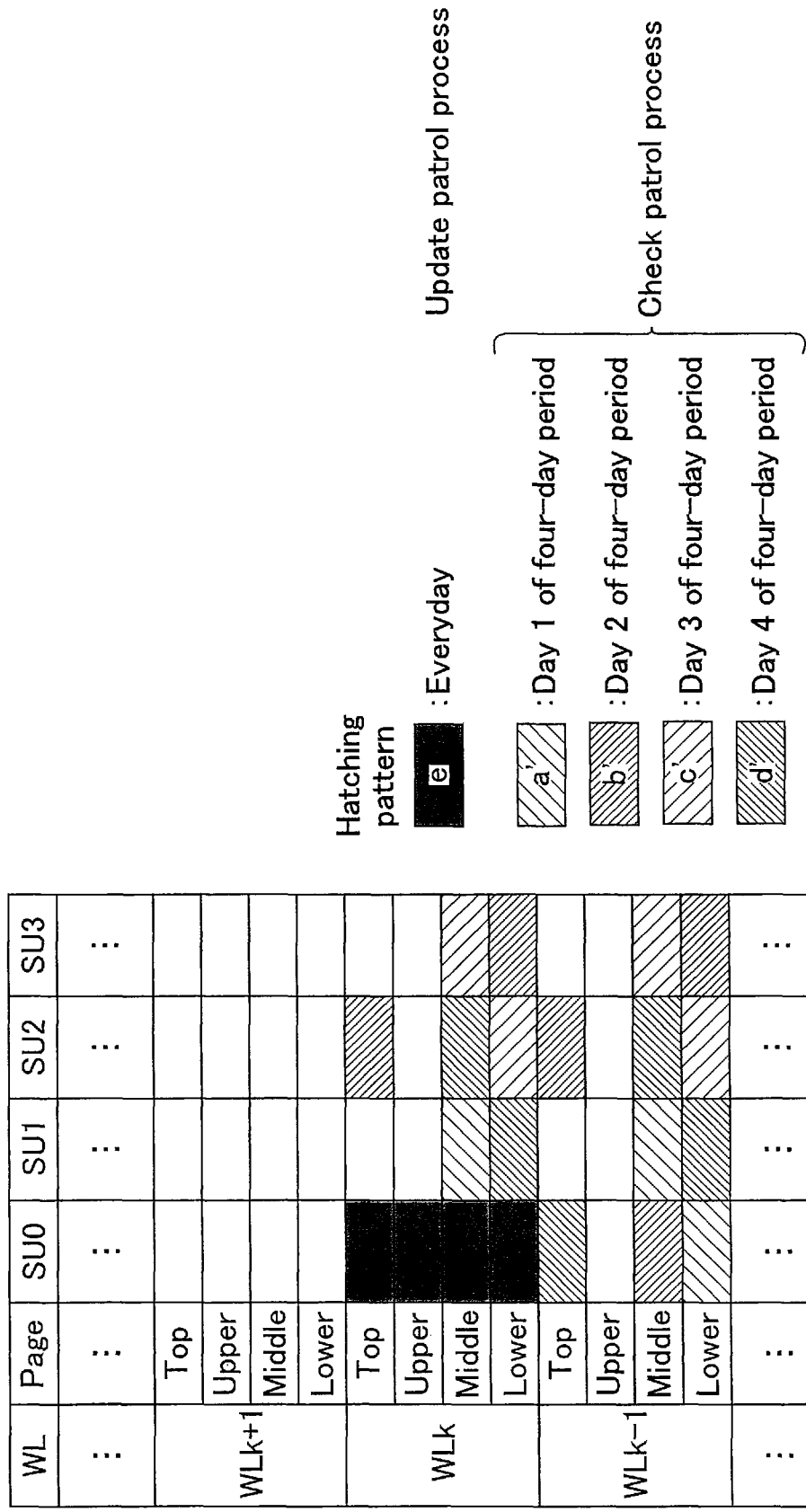
FIG. 14 is a schematic diagram for illustrating the second example of the patrol mode registered in the information processing system according to the first embodiment.

FIG. 13 is a command sequence illustrating a registration operation of the second example of the patrol mode in the information processing system according to the first embodiment. FIG. 14 is a schematic diagram illustrating the second example of the patrol mode registered in the information processing system according to the first embodiment. FIG. 13 shows a concrete example of a command set from the host device 2 for registering the second example of the patrol mode. In FIG. 14, four kinds of check patrol process and one kind of update patrol process that are set according to the command sequence of FIG. 13 are visually differentiated using five hatching patterns (a') to (d') and (e).

As shown on the first line of FIG. 13, the host device 2 issues patrol mode registration command "SetPatCom PatrolMode-B 12". Upon receipt of the command, the memory controller 30 recognizes that a group of patrol processes represented by a set of subsequent twelve commands is defined as patrol mode B.

Next, as shown on the second and third lines of FIG. 13, the host device 2 issues two patrol management information set commands, "PatrolSet<allWL-SU0-P0><Pr1><Pe4D-1><WCheck>" and "PatrolSet<allWL-SU1-P1><Pr1><Pe4D-1><WCheck>". Upon receipt of the commands, the memory controller 30 recognizes that the patrol mode B includes check patrol processes that target lower pages of string unit SU0 and middle pages of string unit SU1 in all word lines WL in a block BLK of the patrol mode registration target, in which the check patrol processes are executed on day 1 of the four-day period and have the next highest priority after the host read process.

Next, as shown on the fourth to sixth lines of FIG. 13, the host device 2 issues three patrol management information set commands, "PatrolSet<allWL-SU0-P1><Pr1><Pe4D-2><WCheck>", "PatrolSet<allWL-SU2-P3><Pr1><Pe4D-2><WCheck>", and "PatrolSet<allWL-SU3-P0><Pr1><Pe4D-2><WCheck>". Upon receipt of the commands, the memory controller 30 recognizes that the patrol mode B includes check patrol processes that target middle pages of string unit SU0, top pages of string unit SU2, and lower pages of string unit SU3 in all word lines WL in the block BLK of the patrol mode registration target, in which the check patrol processes are executed on day 2 of the four-day period and have the next highest priority after the host read process.

Next, as shown on the seventh and eighth lines of FIG. 13, the host device 2 issues two patrol management information set commands, "PatrolSet<allWL-SU2-P0><Pr1><Pe4D-3><WCheck>" and "PatrolSet<allWL-SU3-P1><Pr1><Pe4D-3><WCheck>". Upon receipt of the commands, the memory controller 30 recognizes that the patrol mode B includes check patrol processes that target lower pages of string unit SU2 and middle pages of string unit SU3 in all word lines WL in the block BLK of the patrol mode registration target, in which the check patrol processes are executed on day 3 of the four-day period and have the next highest priority after the host read process.

Next, as shown on the ninth to eleventh lines of FIG. 13, the host device 2 issues three patrol management information set commands, "PatrolSet<allWL-SU0-P3><Pr1><Pe4D-0><WCheck>", "PatrolSet<allWL-SU1-P0><Pr1><Pe4D-0><WCheck>", and "PatrolSet<allWL-SU2-P1><Pr1><Pe4D-0><WCheck>". Upon receipt of the commands, the memory controller 30 recognizes that the patrol mode B includes check patrol processes that target top pages of string unit SU0, lower pages of string unit SU1, and middle pages of string unit SU2, in all word lines WL of the block BLK of the patrol mode registration target, in which the check patrol processes are executed on day 4 of the four-day period, and have the next highest priority after the host read process.

Next, as shown on the twelfth line of FIG. 13, the host device 2 issues one patrol management information set command "PatrolUnSet<WLk+1-allSU-allP><WCheck>". Upon receipt of the command, the memory controller 30 recognizes that a schedule of word line WLk+1 is invalid of those recognized at the second to eleventh lines of FIG. 13 described above. In this manner, the memory controller 30 recognizes the schedules corresponding to the hatching patterns (a') to (d') in FIG. 14.

Next, as shown on the thirteenth line of FIG. 13, the host device 2 issues one patrol management information set command "PatrolSet<WLk-SU0-allP><Pr0><Pe1D><WUpdate>". Upon receipt of the command, the memory controller 30 recognizes that the patrol mode B includes an update patrol process that targets all pages corresponding to word line WLk and string unit SU0, and that is executed with the highest priority every day. The above-described command at the thirteenth line of FIG. 13 corresponds to hatching pattern (e) of FIG. 14.

In this manner, the memory controller 30 can register the second example of the patrol mode as in FIG. 14.

1.2.2.3 Third Example (Patrol Mode C)

Next, a third example of the patrol mode will be described. In the third example, in one block BLK range, eight kinds of check patrol process are set exhaustively in which the period is equal but the execution date differs for each other.

Figure 15:
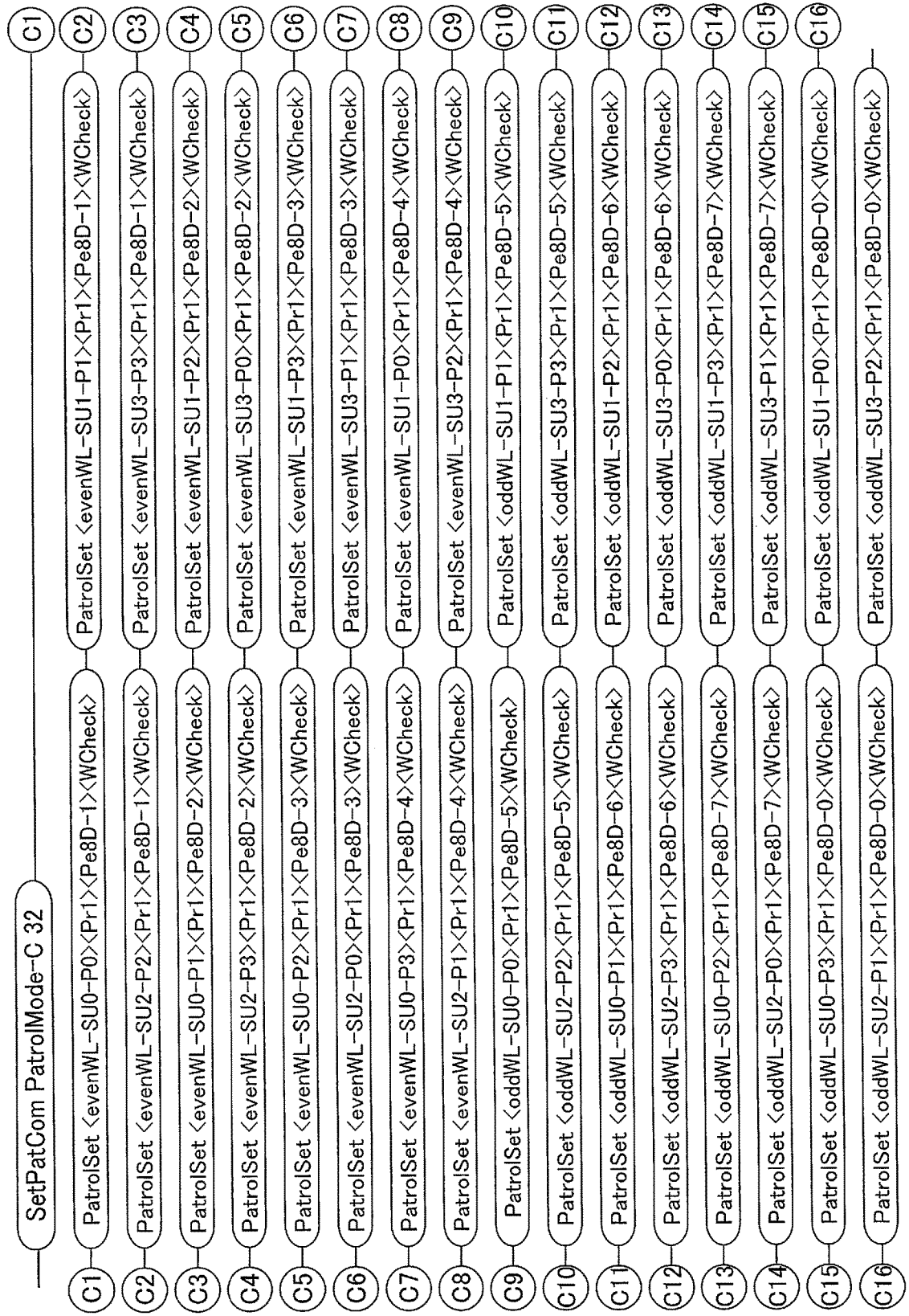
FIG. 15 is a command sequence for illustrating a registration operation of a third example of the patrol mode in the information processing system according to the first embodiment.
Figure 16:
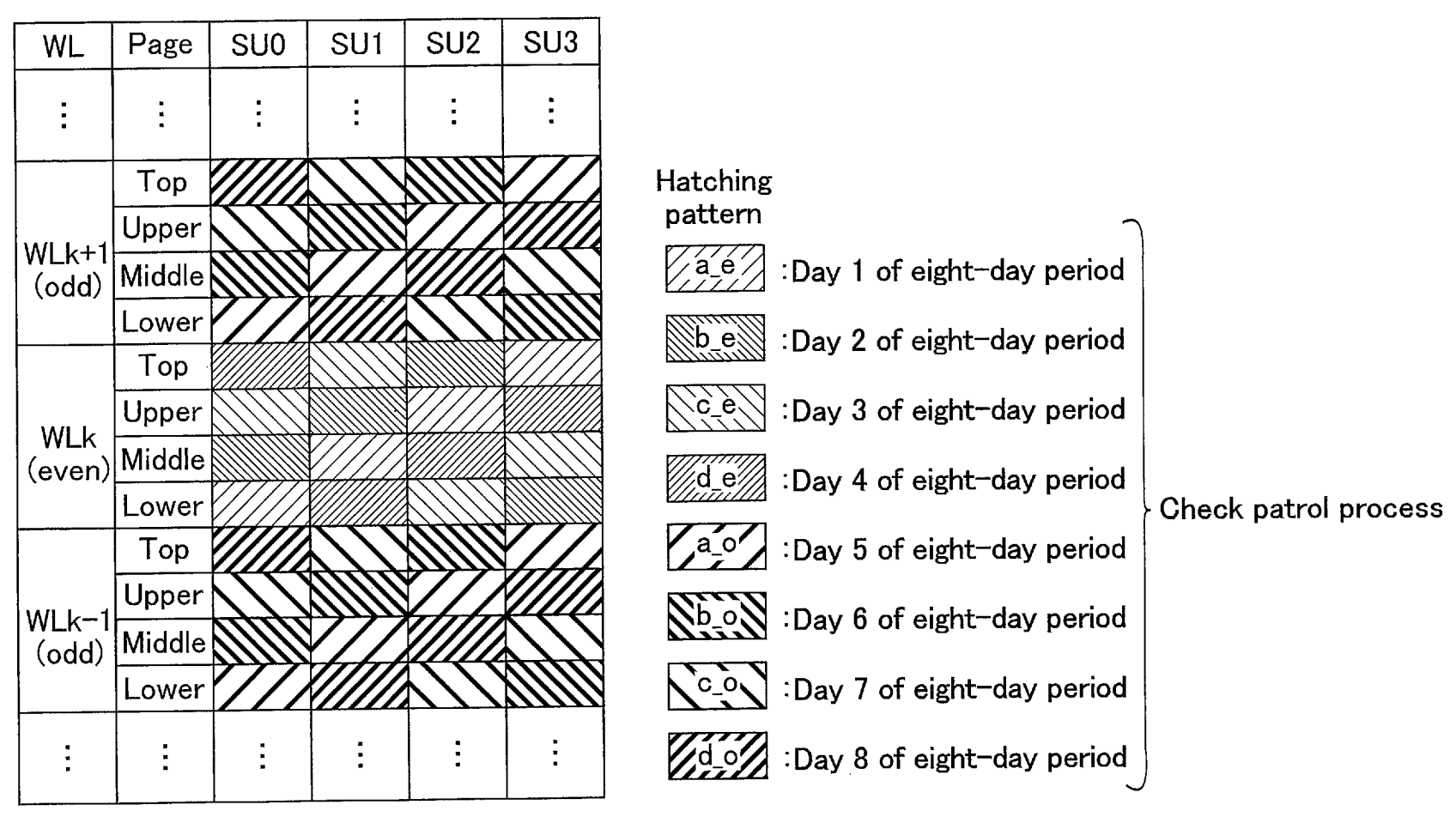

FIG. 15 is a command sequence illustrating a registration operation of the third example of the patrol mode in the information processing system according to the first embodiment. FIG. 16 is a schematic diagram illustrating the third example of the patrol mode registered in the information processing system according to the first embodiment. FIG. 15 shows a concrete example of commands from the host device 2 for registering the third example of the patrol mode. In FIG. 16, eight kinds of check patrol process that are set according to the command sequence of FIG. 15 are visually differentiated using eight hatching patterns (a_e) to (d_e) and (a_o) to (d_o).

As shown on the first line of FIG. 15, the host device 2 issues patrol mode registration command "SetPatCom PatrolMode-C 32". Upon receipt of the command, the memory controller 30 recognizes that a group of patrol processes represented by a set of subsequent thirty two commands is defined as patrol mode C.

Next, as shown on the second and third lines of FIG. 15, the host device 2 issues four patrol management information set commands, "PatrolSet<evenWL-SU0-P0><Pr1><Pe8D-1><WCheck>", "PatrolSet<evenWL-SU1-P1><Pr1><Pe8D-1><WCheck>", "PatrolSet<evenWL-SU2-P2><Pr1><Pe8D-1><WCheck>", and "PatrolSet<evenWL-SU3-P3><Pr1><Pe8D-1><WCheck>". Upon receipt of the commands, the memory controller 30 recognizes that the patrol mode C includes check patrol processes that target lower pages of string unit SU0, middle pages of string unit SU1, upper pages of string unit SU2, and top pages of string unit SU3 in even-numbered word lines WL of a block BLK of a patrol mode registration target, in which the check patrol processes are executed on day 1 of the eight-day period and have the next highest priority after the host read process. The above-described commands at the second and third lines of FIG. 15 correspond to hatching pattern (a_e) of FIG. 16.

Next, as shown on the fourth and fifth lines of FIG. 15, the host device 2 issues four patrol management information set commands, "PatrolSet<evenWL-SU0-P1><Pr1><Pe8D-2><WCheck>", "PatrolSet<evenWL-SU1-P2><Pr1><Pe8D-2><WCheck>" "PatrolSet<evenWL-SU2-P3><Pr1><Pe8D-2><WCheck>", and "PatrolSet<even WL-SU3-P0><Pr1><Pe8D-2><WCheck>". Upon receipt of the commands, the memory controller 30 recognizes that the patrol mode C includes check patrol processes that target middle pages of string unit SU0, upper pages of string unit SU1, top pages of string unit SU2, and lower pages of string unit SU3 in even-numbered word lines WL of the block BLK of the patrol mode registration target, in which the check patrol processes are executed on day 2 of the eight-day period and have the next highest priority after the host read process. The above-described commands on the fourth and fifth lines of FIG. 15 correspond to hatching pattern (b e) of FIG. 16.

Next, as shown on the sixth and seventh lines of FIG. 15, the host device 2 issues four patrol management information set commands, "PatrolSet<evenWL-SU0-P2><Pr1><Pe8D-3><WCheck>", "PatrolSet<evenWL-SU1-P3><Pr1><Pe8D-3><WCheck>", "PatrolSet<evenWL-SU2-P0><Pr1><Pe8D-3><WCheck>", and "PatrolSet<evenWL-SU3-P1><Pr1><Pe8D-3><WCheck>". Upon receipt of the commands, the memory controller 30 recognizes that the patrol mode C includes check patrol processes that target upper pages of string unit SU0, top pages of string unit SU1, lower pages of string unit SU2, and middle pages of string unit SU3 in even-numbered word lines WL in the block BLK of the patrol mode registration target, in which the check patrol processes are executed on day 3 of the eight-day period and have the next highest priority after the host read process. The above-described commands at the sixth and seventh lines of FIG. 15 correspond to hatching pattern (c_e) of FIG. 16.

Next, as shown on the eighth and ninth lines of FIG. 15, the host device 2 issues four patrol management information set commands, "PatrolSet<evenWL-SU0-P3><Pr1><Pe8D-4><WCheck>", "PatrolSet<evenWL-SU1-P0><Pr1><Pe8D-4><WCheck>", "PatrolSet<evenWL-SU2-P1><Pr1><Pe8D-4><WCheck>", and "PatrolSet<evenWL-SU3-P2><Pr1><Pe8D-4><WCheck>". Upon receipt of the commands, the memory controller 30 recognizes that the patrol mode C includes check patrol processes that target top pages of string unit SU0, lower pages of string unit SU1, middle pages of string unit SU2, and upper pages of string unit SU3 in even-numbered word lines WL in the block BLK of the patrol mode registration target, in which the check patrol processes are executed on day 4 of the eight-day period and have the next highest priority after the host read process. The above-described commands at the eighth and ninth lines of FIG. 15 correspond to hatching pattern (d_e) of FIG. 16.

Next, as shown on the tenth and eleventh lines of FIG. 15, the host device 2 issues four patrol management information set commands, "PatrolSet<oddWL-SU0-P0><Pr1><Pe8D-5><WCheck>", "PatrolSet<oddWL-SU1-P1><Pr1><Pe8D-5><WCheck>", "PatrolSet<oddWL-SU2-P2><Pr1><Pe8D-5><WCheck>", and "PatrolSet<oddWL-SU3-P3><Pr1><Pe8D-5><WCheck>". Upon receipt of the commands, the memory controller 30 recognizes that the patrol mode C includes check patrol processes that target lower pages of string unit SU0, middle pages of string unit SU1, upper pages of string unit SU2, and top pages of string unit SU3 in odd-numbered word lines WL of a block BLK of a patrol mode registration target, in which the check patrol processes are executed on day 5 of the eight-day period and have the next highest priority after the host read process. The above-described commands at the tenth and eleventh lines of FIG. 15 correspond to hatching pattern (a_o) of FIG. 16.

Next, as shown on the twelfth and thirteenth lines of FIG. 15, the host device 2 issues four patrol management information set commands, "PatrolSet<oddWL-SU0-P1><Pr1><Pe8D-6><WCheck>", "PatrolSet<oddWL-SU1-P2><Pr1><Pe8D-6><WCheck>", "PatrolSet<oddWL-SU2-P3><Pr1><Pe8D-6><WCheck>", and "PatrolSet<oddWL-SU3-P0><Pr1><Pe8D-6><WCheck>". Upon receipt of the commands, the memory controller 30 recognizes that the patrol mode C includes check patrol processes that target middle pages of string unit SU0, upper pages of string unit SU1, top pages of string unit SU2, and lower pages of string unit SU3 in odd-numbered word lines WL of the block BLK of the patrol mode registration target, in which the check patrol processes are executed on day 6 of the eight-day period and have the next highest priority after the host read process. The above-described commands at the twelfth and thirteenth lines of FIG. 15 correspond to hatching pattern (b_o) of FIG. 16.

Next, as shown on the fourteenth and fifteenth lines of FIG. 15, the host device 2 issues four patrol management information set commands, "PatrolSet<oddWL-SU0-P2><Pr1><Pe8D-7><WCheck>", "PatrolSet<oddWL-SU1-P3><Pr1><Pe8D-7><WCheck>", "PatrolSet<oddWL-SU2-P0><Pr1><Pe8D-7><WCheck>", and "PatrolSet<oddWL-SU3-P1><Pr1><Pe8D-7><WCheck>". Upon receipt of the commands, the memory controller 30 recognizes that the patrol mode C includes check patrol processes that target upper pages of string unit SU0, top pages of string unit SU1, lower pages of string unit SU2, and middle pages of string unit SU3 in odd-numbered word lines WL in the block BLK of the patrol mode registration target, in which the check patrol processes are executed on day 7 of the eight-day period and have the next highest priority after the host read process. The above-described commands at the fourteenth and fifteenth lines of FIG. 15 correspond to hatching pattern (c_o) of FIG. 16.

Next, as shown on the sixteenth and seventeenth lines of FIG. 15, the host device 2 issues four patrol management information set commands, "PatrolSet<oddWL-SU0-P3><Pr1><Pe8D-0><WCheck>", "PatrolSet<oddWL-SU1-P0><Pr1><Pe8D-0><WCheck>", "PatrolSet<oddWL-SU2-P1><Pr1><Pe8D-0><WCheck>", and "PatrolSet<oddWL-SU3-P2><Pr1><Pe8D-0><WCheck>". Upon receipt of the commands, the memory controller 30 recognizes that the patrol mode C includes check patrol processes that target top pages of string unit SU0, lower pages of string unit SU1, middle pages of string unit SU2, and upper pages of string unit SU3 in odd-numbered word lines WL in the block BLK of the patrol mode registration target, in which the check patrol process are executed on day 8 of the eight-day period and have the next highest priority after the host read process. The above-described commands at the sixteenth and seventeenth lines of FIG. 15 correspond to hatching pattern (d_o) of FIG. 16.

In this manner, the memory controller 30 can register the third example of the patrol mode as in FIG. 16.

1.2.3 Command Sequence of Patrol Management Information Setting Operation

Next, with reference to a command sequence shown in FIG. 17, a description will be given of an example of an operation of setting the patrol management information 21 using the patrol modes A to C registered as described above.

Figure 17:
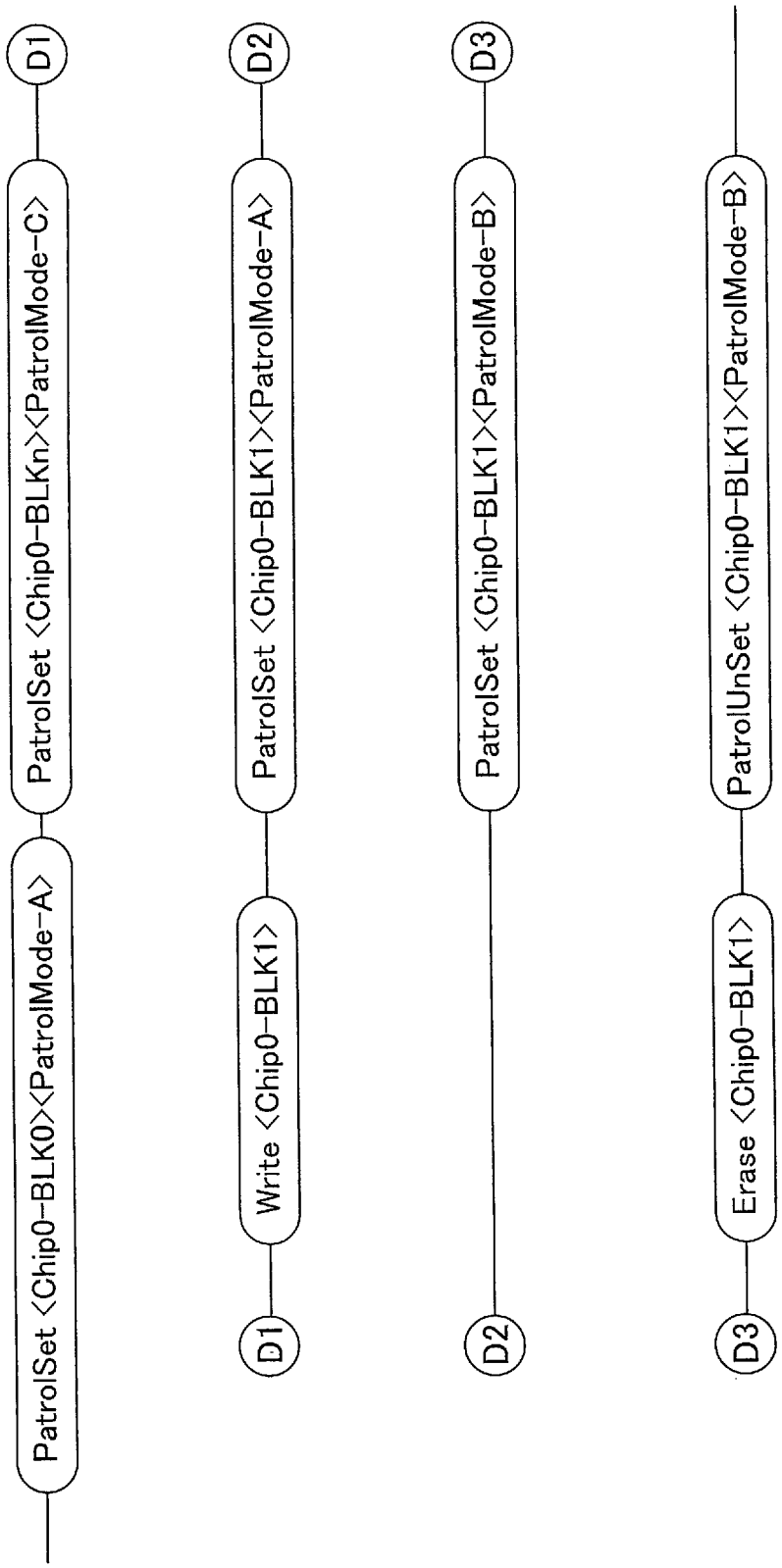
FIG. 17 is a command sequence for illustrating a patrol mode setting operation in the information processing system according to the first embodiment.

As shown on the first line of FIG. 17, the host device 2 issues two patrol management information set commands, "PatrolSet<Chip0-BLK0><PatrolMode-A>" and "PatrolSet<Chip0-BLKn><PatrolMode-C>". Upon receipt of the commands, the memory controller 30 sets the patrol management information 21 so that the groups of patrol processes defined by the patrol modes A and C are executed on blocks BLK0 and BLKn, respectively, of the chip 10-0. In this manner, based on the command from the host device 2, the memory controller 30 can execute the patrol processes according to the schedules of different execution frequencies on difference blocks BLK. An assumed case where such schedules are set is when the block BLKn is used as a copy region of block BLK0 and the frequency of execution of the patrol process on the block BLKn may be reduced as long as data of the block BLK0 can be accurately read.

Next, as shown on the second line of FIG. 17, the host device 2 issues write request "Write<Chip0-BLK1>", and patrol management information set command "PatrolSet<Chip0-BLK1><PatrolMode-A>". Upon receipt of the commands, the memory controller 30 sets the patrol management information 21 so that data is written into the block BLK1 of the chip 10-0 and the group of patrol processes defined by the patrol mode A is executed on the write target region. By using the patrol mode registered in advance, it is possible to realize a series of processes shown in steps ST6 to ST9 of FIG. 10 with two commands between the host device 2 and the memory system 3.

Next, as shown on the third line of FIG. 17, the host device 2 issues patrol management information set command "PatrolSet<Chip0-BLK1><PatrolMode-B>". Upon receipt of the command, the memory controller 30 updates the patrol management information 21 so that the patrol mode set on the block BLK1 of the chip 10-0 is changed from the patrol mode A to the patrol mode B. Thus, by using the patrol mode registered in advance, it is possible to realize a series of processes shown in steps ST10 and ST11 of FIG. 10 with one command between the host device 2 and the memory system 3.

Next, as shown on the fourth line of FIG. 17, the host device 2 issues erase or invalidate request "Erase<Chip0-BLK1>", and patrol management information delete command "PatrolUnSet<Chip0-BLK1><PatrolMode-B>". Upon receipt of the commands, the memory controller 30 sets the patrol management information 21 so that the data written into the block BLK1 of the chip 10-0 is erased or invalidated, and the group of patrol processes defined by the patrol mode B set on the erase or invalidate target region is deleted. Thus, by using the patrol mode registered in advance, it is possible to realize a series of processes shown in steps ST12 to ST15 of FIG. 10 with two commands between the host device 2 and the memory system 3.

1.2.4 Series of Operations Including Patrol Process

Next, a series of operations including the patrol process in the information processing system according to the first embodiment will be described.

1.2.4.1 Flowchart

Figure 18:
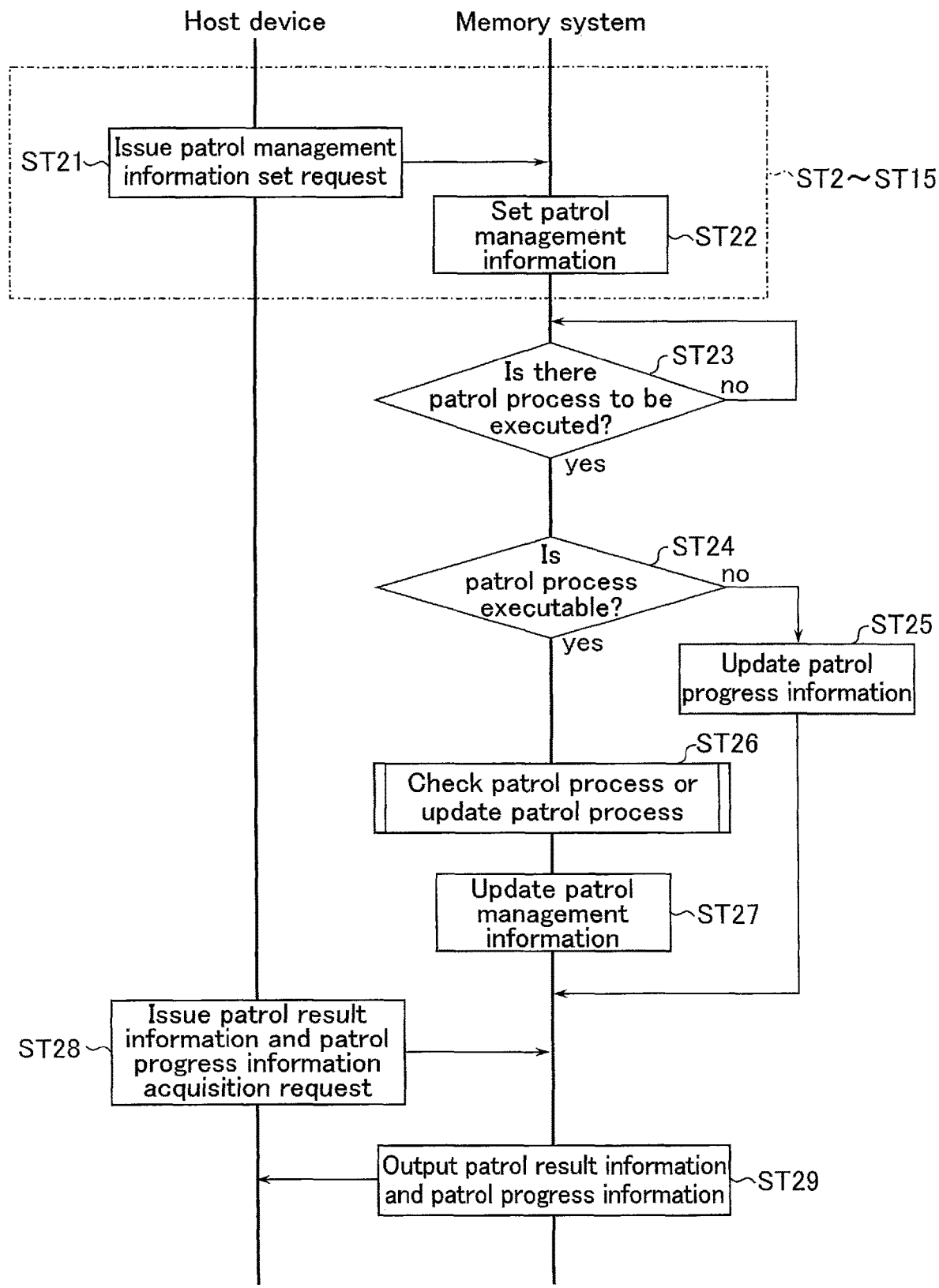
FIG. 18 is a flowchart for illustrating a series of operations including a patrol process in the information processing system according to the first embodiment.

FIG. 18 is a flowchart illustrating a series of operations including the patrol process in the information processing system according to the first embodiment. FIG. 18 shows a flow of a series of operations including the patrol process executed based on the patrol management information setting operation described with reference to FIG. 10, etc.

As shown in FIG. 18, in step ST21, the host device 2 issues a patrol management information set request (command set), and transmits it to the memory system 3. In step ST22, upon receipt of the patrol management information set request, the memory system 3 sets the patrol management information 21. Steps ST21 and ST22 correspond to, for example, steps ST2 to ST15 of FIG. 10.

In step ST23, the memory controller 30 refers to the patrol management information 21, and determines whether there is a patrol process to be executed. If there is a patrol process to be executed (step ST23; yes), the processing proceeds to step ST24, and if there is no patrol process to be executed (step ST23; no), the processing returns to step ST23. Thus, execution of the patrol process is suspended until a timing at which the patrol specification unit PU set in the patrol management information 21 should be executed, and the processing proceeds to step ST24 when the execution timing is reached.

In step ST24, the memory controller 30 determines whether the patrol process determined to be executed is executable. If the patrol process is executable (step ST24; yes), the processing proceeds to step ST26, and if the patrol process is not executable (step ST24; no), the processing proceeds to step ST25. An assumed case where the processing proceeds to step ST25 is when the memory controller 30 receives, at the timing at which the patrol process should be executed, a request for executing a process with a priority higher than that of the patrol process (e.g., a host read process), from the host device 2.

In step ST25, the memory controller 30 stores, in the patrol progress information 23, an identifier of the patrol specification unit PU corresponding to the patrol process determined to be non-executable. Thus, information indicating the delay in the patrol process is stored in the patrol progress information 23 until the delayed patrol process is executed. After step ST25, the processing omits steps ST26 and ST27.

In step ST26, the memory system 3 executes either the check patrol process or the update patrol process based on the type of the patrol process determined to be executable. The memory controller 30 stores the result of the check patrol process or the update patrol process in the patrol result information 22. Details of the check and update patrol processes will be described later.

In step ST27, the memory controller 30 updates the patrol management information 21. Specifically, for example, the corresponding patrol specification unit PU in the patrol management information 21 is reset in accordance with the period of the patrol process executed.

In step ST28, the host device 2 issues a patrol result information and patrol progress information acquisition request (command set).

In step ST29, the memory controller 30 outputs the patrol result information 22 and the patrol progress information 23 to the host device 2.

This ends the series of operations including the patrol process.

1.2.4.2 Check Patrol Process

Figure 19:
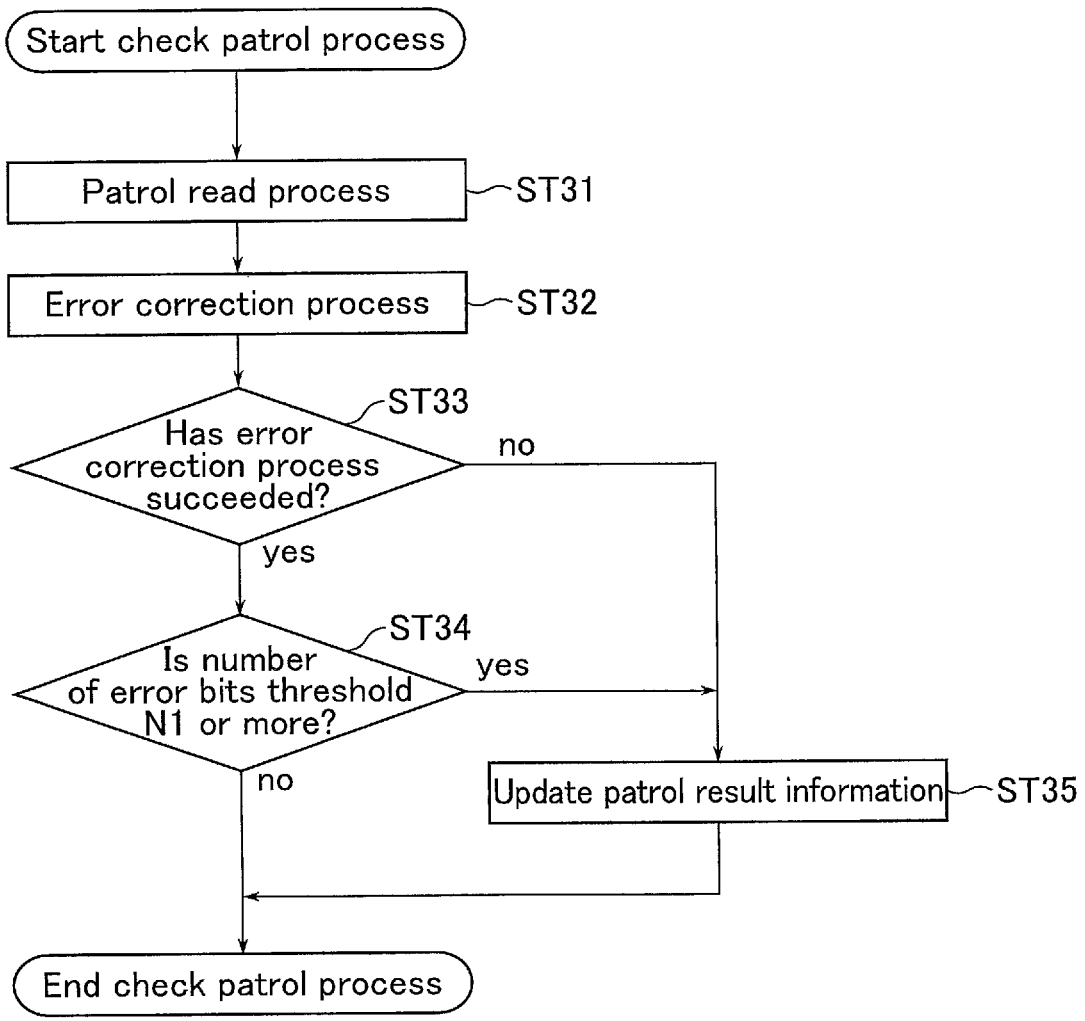
FIG. 19 is a flowchart for illustrating a check patrol process in the information processing system according to the first embodiment.

Next, a check patrol process in the information processing system according to the first embodiment will be described. FIG. 19 is a flowchart illustrating a check patrol process in the information processing system according to the first embodiment.

As shown in FIG. 19, in step ST31, the memory system 3 executes a patrol read process. Specifically, the memory controller 30 issues a read command and transmits it to the NAND flash memory 10. The read command includes, for example, physical address ADD that specifies a patrol target page, and a digital to analogue convertor (DAC) value that specifies a read voltage applied in the patrol read process. Upon receipt of the read command, the NAND flash memory 10 reads data from the patrol target page using the specified read voltage and outputs it to the memory controller 30. The patrol read process in the check patrol process is executed with one page as a unit for patrol.

The DAC value contained in the read command corresponds to, for example, an amount of change from the initial value of the read voltage. The memory controller 30 stores the DAC value in advance based on the result of the update patrol process executed before step ST31. Thereby, the memory system 3 can execute the patrol read process using the read voltage based on the latest update patrol process result.

In step ST32, the ECC circuit 34 in the memory controller 30 executes an error correction process on data read from the NAND flash memory 10 by the patrol read process.

In step ST33, the memory controller 30 determines whether the error correction process has succeeded. If the error correction process has succeeded (step ST33; yes), the processing proceeds to step ST34, and if the error correction process has not succeeded (step ST34; no), the processing proceeds to step ST35.

In step ST34, the memory controller 30 determines whether the number of error bits detected by the error correction process is threshold N1 or more. If the number of error bits is threshold N1 or more (step ST34; yes), the processing proceeds to step ST35, and if the number of error bits is less than threshold N1 (step ST34; no), the check patrol process ends.

In step ST35, the memory controller 30 updates the refresh flag corresponding to the block BLK including the patrol target in the patrol result information 22 to "True". Thus, the memory controller 30 can store that the number of error bits included in data read from the patrol target is threshold N1 or more, and that the block BLK including the patrol target requires the refresh process.

This ends the check patrol process.

1.2.4.3 Update Patrol Process

Figure 20:
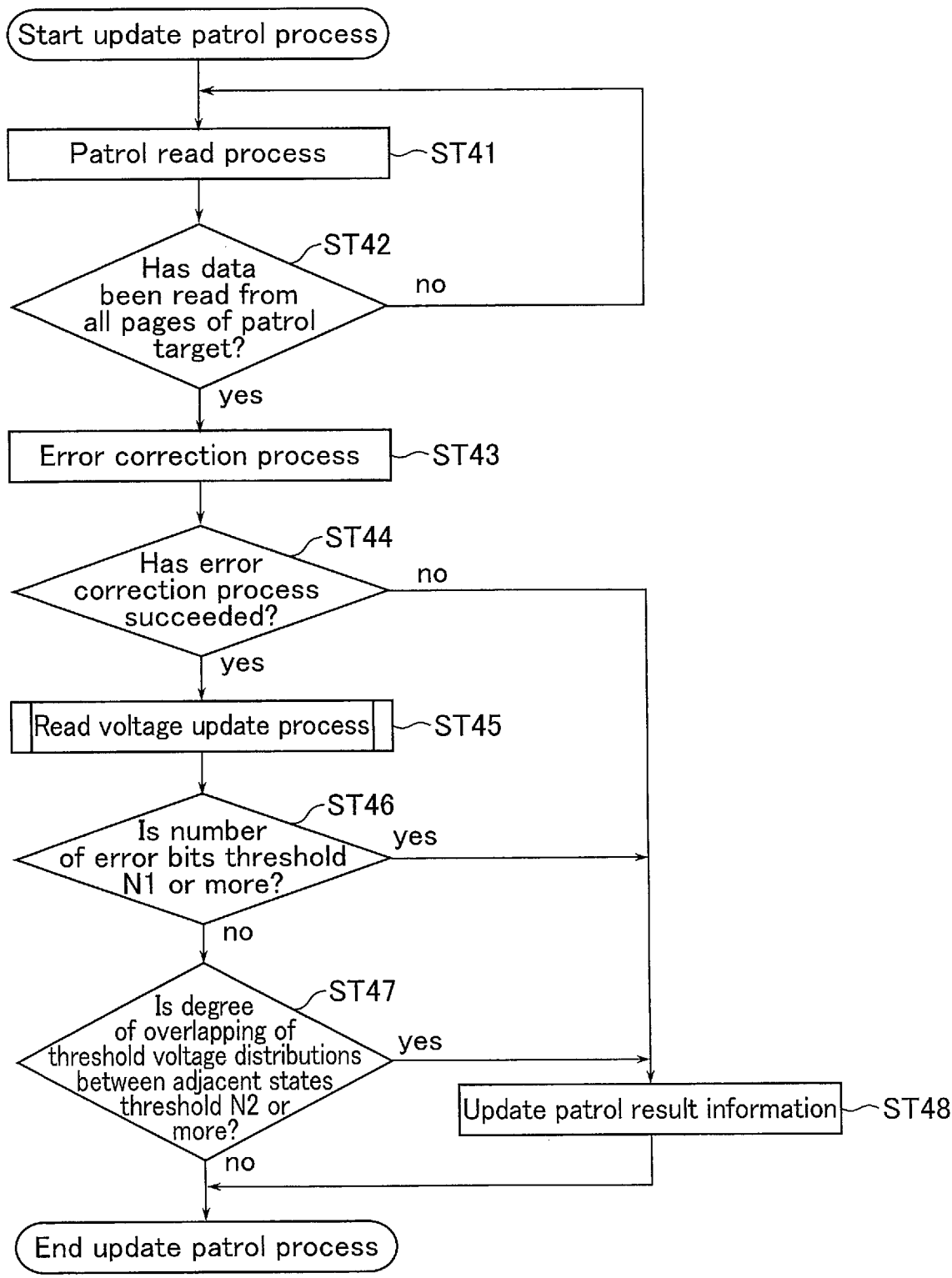
FIG. 20 is a flowchart for illustrating an update patrol process in the information processing system according to the first embodiment.

Next, an update patrol process in the information processing system according to the first embodiment will be described. FIG. 20 is a flowchart illustrating an update patrol process in the information processing system according to the first embodiment.

As shown in FIG. 20, in step ST41, the memory system 3 executes a patrol read process. As the patrol read process is the same as that described for step ST31 of FIG. 19, description thereof will be omitted.

In step ST42, the memory controller 30 determines whether data has been read from all pages of the patrol target. If data has been read from all pages of the patrol target (step ST42; yes), the processing proceeds to step ST43, and if there is a page from which data has not been read of pages of the patrol target (step ST42; no), the processing returns to step ST41.

In the update patrol process, unlike in the check patrol process, a read voltage update process described below is executed using data that is read from one or a plurality of pages in the same cell unit CU. For example, in the patrol mode B shown in FIGS. 13 and 14, the update patrol process executes the read voltage update process using all data items read from the four pages in the same cell unit CU. For this reason, the memory controller 30 repeats step ST41 for the predetermined number of pages used for the read voltage update process.

In step ST43, the ECC circuit 34 in the memory controller 30 executes an error correction process on data read in step ST41. Thereby, the memory controller 30 acquires error-corrected data of data read by the patrol read process.

In step ST44, the memory controller 30 determines whether the error correction process has succeeded. If the error correction process has succeeded on all pages (step ST44; yes), the processing proceeds to step ST45, and if there is at least one page for which the error correction process has not succeeded (step ST45; no), the processing proceeds to step ST48.

In step ST45, the memory controller 30 executes the read voltage update process. Thereby, the memory controller 30 calculates an update value of the read voltage, and stores a DAC value corresponding to the calculated updated read voltage. The read voltage update process will be described later.

In step ST46, the memory controller 30 determines whether the number of error bits detected by the error correction process is threshold N1 or more. If the number of error bits is threshold N1 or more (step ST46; yes), the processing proceeds to step ST48, and if the number of error bits is less than threshold N1 (step ST46; no), the process proceeds to step ST47.

In step ST47, the memory controller 30 determines, based on the data read in step ST41 and the error-corrected data acquired in step ST43, whether a degree of overlapping of threshold voltage distributions between adjacent states (e.g., between "Er" state and "A" state") (the number of error bits) is threshold N2 or more. If the degree of overlapping of threshold voltage distributions between adjacent states is threshold N2 or more (step ST47; yes), the processing proceeds to step ST48, and if it is less than threshold N2 (step ST47; no), the update patrol process ends.

In step ST48, the memory controller 30 updates the refresh flag corresponding to the block BLK including the patrol target in the patrol result information 22 to "True". Thereby, the memory controller 30 can store that the number of error bits included in data read from the patrol target is threshold N1 or more, or the expansion degree of threshold voltage distributions of the patrol target is threshold N2 or more, and that the block BLK including the patrol target requires the refresh process.

This ends the update patrol process.

In the example of FIG. 20, the error correction process is executed after the patrol read process is executed on data items of all pages of the patrol target, but the present invention is not limited thereto. For example, the ECC circuit 34 may execute the error correction process every time the data is read in the page unit from the NAND flash memory 10.

Figure 21:
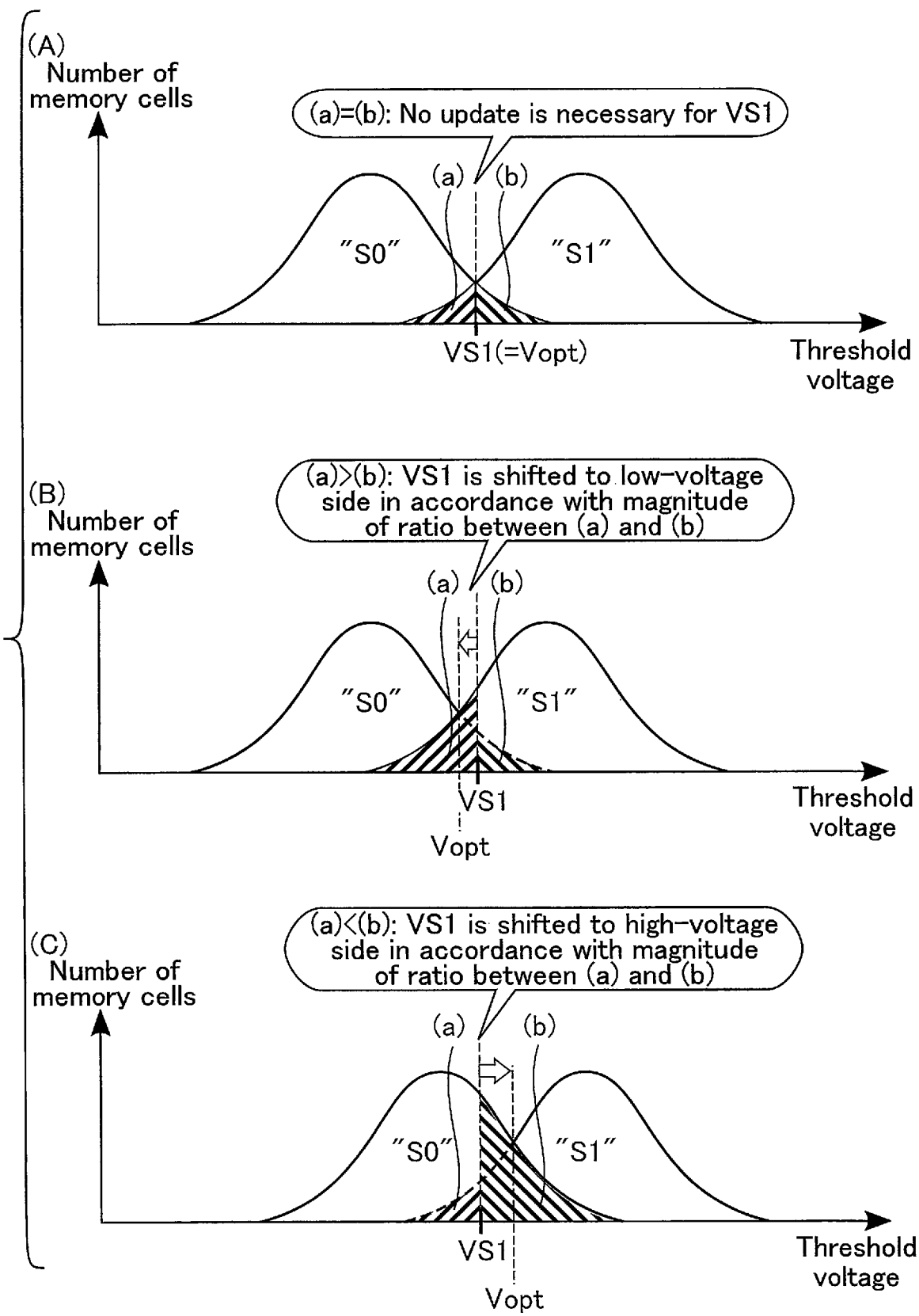
FIG. 21 is a schematic diagram for illustrating the update patrol process in the information processing system according to the first embodiment.

FIG. 21 is a schematic diagram illustrating a read voltage update process in the information processing system according to the first embodiment. As an example, FIG. 21 shows two threshold voltage distributions corresponding to the "S0" and "S1" states, and how read voltage VS1 is updated according to the degree of overlapping.

FIG. 21(A) shows a case where the read voltage VS1 is equal to threshold voltage Vopt at which two threshold voltage distributions corresponding to the "S0" and "S1" states intersect. In the case illustrated in FIG. 21(A), the number of memory cells E10 in which the "S1" state is erroneously read as the "S0" state (corresponding to an area of region (a) in FIG. 21(A)) and the number of memory cells E01 in which the "S0" state is erroneously read as the "S1" state (region (b) in FIG. 21(A)) are equal. In this case, the number of error bits E (the sum of the number of memory cells E01 and E10) is expected to be minimum, and therefore, the memory controller 30 determines that the read voltage VS1 does not need to be updated.

FIG. 21(B) shows a case where the read voltage VS1 is located on a high-voltage side with respect to the threshold voltage Vopt at which the two threshold voltage distributions corresponding to the "S0" and "S1" states intersect. In the case illustrated in FIG. 21(B), the number of memory cells E10 is larger than the number of memory cells E01. In this case, the number of error bits E is larger than the number of error bits E of FIG. 21(A), which is not preferable. Thus, the memory controller 30 shifts the read voltage VS1 to the low-voltage side so as to be closer to the voltage Vopt.

FIG. 21(C) shows a case in which the read voltage VS1 is located on the low-voltage side with respect to the threshold voltage Vopt at which the two threshold voltage distributions corresponding to the "S0" and "S1" states intersect. In the case illustrated in FIG. 21(C), the number of memory cells E10 is smaller than the number of memory cells E01. In this case, the number of error bits E is smaller than the number of error bits E of FIG. 21(A), which is not preferable. Thus, the memory controller 30 shifts the read voltage VS1 to the high-voltage side so as to be closer to the voltage Vopt.

An absolute value of the difference between the number of memory cells E01 and the number of memory cells E10 is expected to increase the farther the read voltage VS1 departs from the threshold voltage Vopt. Therefore, the memory controller 30 determines the shift amount of the read voltage VS1 in accordance with the magnitude of the ratio between the region (a) and the region (b). Thereby, it is possible to determine an appropriate shift amount according to the degree of overlapping of the threshold voltage distributions, and to update the read voltage VS1 so as to be closer to the ideal voltage Vopt.

1.2.4.4 Reflecting Update Patrol Process Result in Check Patrol Process

The read voltage updated by the above-described update patrol process is applied to the check patrol process scheduled to be executed subsequently.

Figure 22:
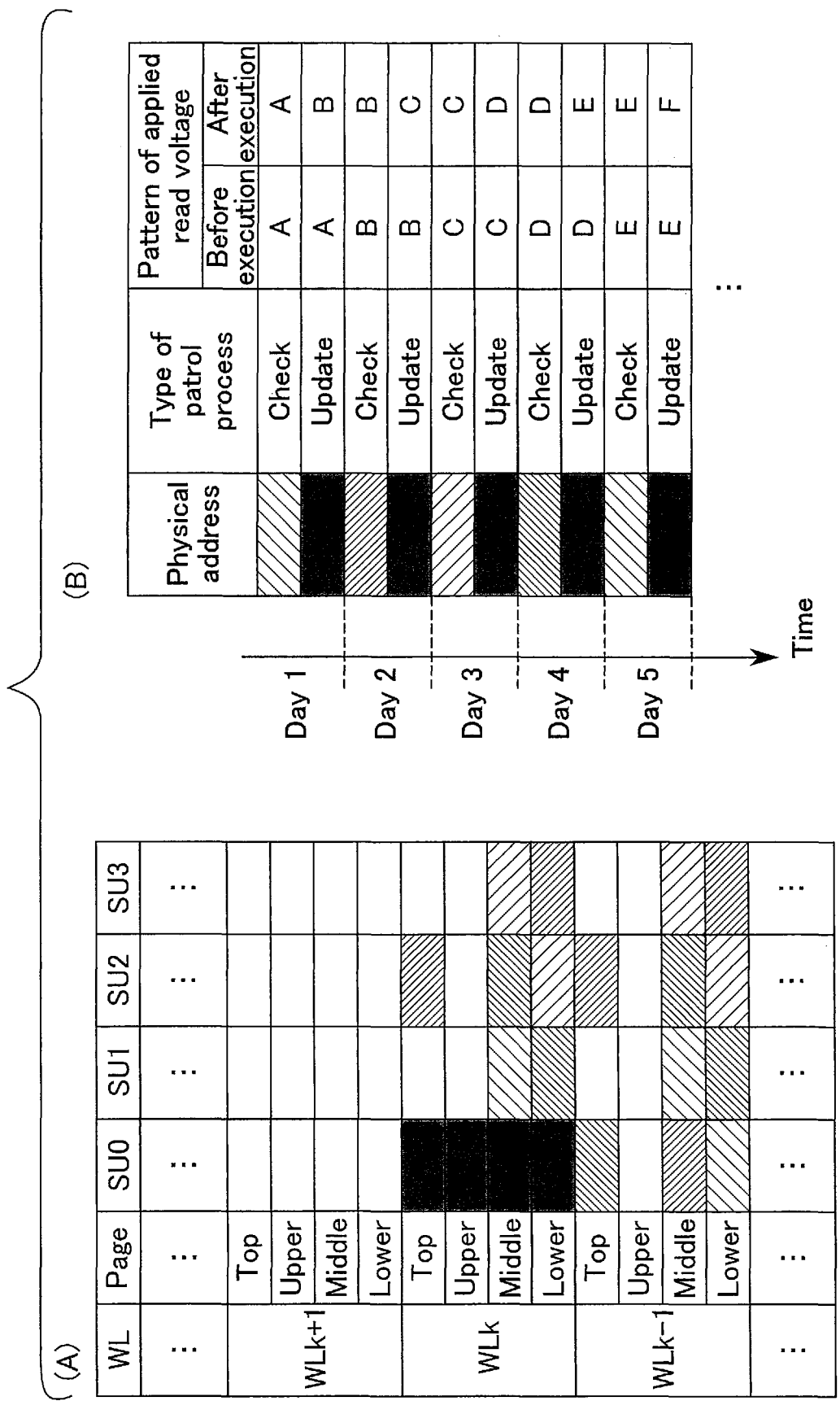
FIG. 22 is a schematic diagram for illustrating a relationship between the update patrol process and the check patrol process in the information processing system according to the first embodiment.

FIG. 22 is a schematic diagram illustrating the relationship between the update patrol process and the check patrol process in the information processing system according to the first embodiment. FIG. 22 shows an example in which in the patrol mode B, the update patrol process result is reflected in the check patrol process. Specifically, FIG. 22(A) shows the physical addresses to which the update patrol process and the check patrol process are applied in the patrol mode B. FIG. 22(B) shows the pattern of the read voltage applied to the read process before and after the update patrol process and the check patrol process in the patrol mode B.

As shown in FIG. 22(B), on day 1 of the four-day period, the check patrol process and the update patrol process are executed in this order. As described above, the check patrol process does not update the read voltage. Thus, before and after the check patrol process, the pattern of the read voltage applied to the patrol read process does not change from "A". Therefore, the read voltage of pattern "A" is applied to the subsequent update patrol process. Then, pattern "A" is updated to pattern "B" by the update patrol process.

Next, on day 2 of the four-day period, the check patrol process and the update patrol process are executed in this order. The physical address on which the check patrol process is executed on day 2 of the four-day period differs from the physical address on which the update patrol process is executed on day 1. However, the read voltage of pattern "B" may be applied to the check patrol process on day 2. Further, the read voltage of pattern "B" is applied to the update patrol process on day 2 in a similar manner. Then, pattern "B" is updated to pattern "C" by the update patrol process. The same applies on day 3 and thereafter.

The pattern of the read voltage updated by the update patrol process is applied to the check patrol process executed in the physical address different from the update patrol process. Thereby, in a range in which the tendency of variation of threshold voltage distributions is deemed to be substantially the same, the pattern of the read voltage in which the number of error bits is expected to be smaller can be shared, and the frequency of occurrence of the refresh process can be reduced.

1.3 Advantageous Effects of Present Embodiment

According to the first embodiment, the host device 2 issues a patrol management information set request, and transmits it to the memory system 3. The patrol management information set request includes information on physical address ADD, priority Pr, type W, and period Pe. Thus, the host device 2 can set the schedule of the patrol process executed by the memory system 3 in a discretionary manner. Therefore, the controllability of the patrol process by the host device 2 can be increased.

Specifically, the host device 2 issues patrol mode registration request "SetPatCom", and transmits it to the memory system 3. Thus, the host device 2 and the memory system 3 can share, in a specified range such as block BLK, a format of the group of patrol processes in which different periods, different priorities, and different types are specified for respective memory regions such as word lines WL, string units SU, and pages P. Thereby, the patrol process setting of each block BLK can be specified by the patrol mode. Therefore, complicated schedules can be set with a small number of commands.

Furthermore, the host device 2 issues a patrol management information delete request, and transmits it to the memory system 3. The patrol management information delete request includes physical address ADD corresponding to the patrol process of the delete target. Thereby, the host device 2 can instruct the memory system 3 not to execute the patrol process determined to be unnecessary. Therefore, it is possible to increase the controllability of the patrol process by the host device 2.

Furthermore, the host device 2 issues a patrol result information and patrol progress information acquisition request, and transmits it to the memory system 3. Thereby, as the result of the patrol process, the host device 2 can properly acquire information on block BLK to be refreshed, information on delayed patrol process, etc. Thus, the host device 2 can determine, based on the information, necessity of executing the refresh process, and necessity of changing priority Pr and period Pe of the patrol process. Therefore, the controllability of the host device 2 can be improved.

1.4 Modification of First Embodiment

The first embodiment is not limited to the above-described example, and can be modified in various manners.

For example, in the above-described first embodiment, schedules of the patrol process are stored with the queue structure in the patrol management information 21; however, the present invention is not limited thereto. For example, schedules of the patrol process may be stored in a table form in the patrol management information 21. In the following, descriptions of the configurations and operations similar to those in the first embodiment will be omitted, and mainly configurations and operations different from those in the first embodiment will be described.

FIG. 23 is a conceptual diagram illustrating the patrol management information 21 of the information processing system according to a modification of the first embodiment. FIG. 23 shows an example in which the patrol management information 21 is stored in a table form.

As shown in FIG. 23, for example, a patrol mode, period Pe, and an execution identifier are associated with each block BLK and stored in the patrol management information 21. In the example of FIG. 23, in block BLK0 and block BLKn, the patrol mode A that repeats every four days is set. In block BLK1, the patrol mode C that repeats every eight days is set. In block BLK2, no patrol mode is set.

The execution identifier corresponds to the execution date of the patrol process, in which when the block BLK is divided into some memory regions (physical addresses ADD), the execution identifier is allocated to each of the divided physical addresses. In the example of FIG. 23, the block BLK is divided into eight physical addresses ADD1 to ADD8. Thus, as an execution identifier corresponding to the blocks BLK0 and BLKn, execution identifier "1" is allocated to physical addresses ADD1 and ADD5 at which the patrol process is executed on day 1 of the four-day period. Similarly, execution identifier "2" is allocated to physical addresses ADD2 and ADD6 at which the patrol process is executed on day 2 of the four-day period. Execution identifier "3" is allocated to physical addresses ADD3 and ADD7 at which the patrol process is executed on day 3 of the four-day period. Execution identifier "0" is allocated to physical addresses ADD4 and ADD8 at which the patrol process is executed on day 4 of the four-day period. Thus, as an execution identifier, a value equivalent to a modulo obtained by division by the period Pe of the execution date of the patrol process is allocated.

The memory controller 30 executes a cyclic operation in which exhaustively referring to the execution identifiers in the patrol management information 21 as described above is repeated periodically. Thereby, it is possible to specify the physical address ADD and the patrol mode of the patrol process to be executed, and to execute the patrol process to be executed at a proper timing.

FIG. 24 is a flowchart illustrating a cyclic operation in the information processing system according to the modification of the first embodiment.

As shown in FIG. 24, in step ST51, the memory controller 30 increments count value cnt. The count value cnt is an integer increased every cyclic operation.

In step ST52, the memory controller 30 initializes variable k to 0.

In step ST53, the memory controller 30 refers to the patrol management information 21, and determines whether there is a physical address ADD for which the execution identifier is set in the block BLKk. If there is a physical address ADD for which the execution identifier is set (step ST53; yes), the processing proceeds to step ST54, and if there is no physical address ADD for which the execution identifier is set (step ST53; no), the processing proceeds to step ST56.

In step ST54, the memory controller 30 selects physical address ADDi corresponding to the execution identifier equal to a modulo (cnt%Pe) obtained by dividing the count value cnt by the period Pe. For example, if k=1 and cnt=5, the patrol mode of block BLKk is patrol mode C (period Pe=8), resulting in cnt%Pe=5; therefore, physical address ADD5 is selected.

In step ST55, the memory system 3 executes the patrol process for the selected physical address ADDi.

In step ST56, the memory controller 30 determines whether all blocks BLK have been circulated.

If there is a block BLK that has not been circulated (step ST56; no), the processing proceeds to step ST57. In step ST57, the memory controller 30 increments the variable k. Subsequently, the processing returns to step ST53. The steps ST53 to ST57 are repeated until all blocks BLK are circulated.

If all blocks BLK are circulated (step ST56; yes), the cyclic operation ends.

In the example described above, the blocks BLK are circulated in ascending order, but the present invention is not limited thereto. For example, if the priority of a block ELK is changed to a higher priority in the middle of the cyclic operation, this block may be circulated on a priority basis. Furthermore, if a lower priority is set for the physical address ADDi selected in step ST54, the patrol process on the physical address ADDi may be skipped according to the situation.

According to the modification of the first example, the memory controller 30 can control the schedule of the patrol process based on information in the table form, instead of the queue structure.

2. Second Embodiment

Next, an information processing system according to a second embodiment will be described. In the second embodiment, the host device 2 issues a command that does not specify period Pe. The memory system 3 differs from that of the first embodiment in terms of executing the patrol process only once according to the command. In the following, the descriptions of the configurations and operations similar to those in the first embodiment will be omitted, and mainly configurations and operations different from those in the first embodiment will be described.

2.1 Series of Operations Including Patrol Process

FIG. 25 is a flowchart illustrating a series of operations including a patrol process in an information processing system according to the second embodiment, and corresponds to FIG. 18 of the first embodiment. In FIG. 25, step ST21A is executed instead of steps ST21 and ST22 of FIG. 18.

In step ST21A, the host device 2 issues patrol run request "PatrolRunRequest", and transmits it to the memory system 3. The patrol run request "PatrolRunRequest" includes information specifying physical address ADD, priority Pr, type W, and management flag F, but does not include information specifying period Pe. Upon receipt of the patrol run request (command set), the memory system 3 executes the processes of steps ST24 to ST27. The processes of steps ST24 to ST27 are similar to those described with reference to FIG. 18, and description thereof will be omitted.

In step ST28, the host device 2 issues a request for acquiring patrol result information and patrol progress information.

In step ST29, the memory controller 30 outputs the patrol result information 22 and the patrol progress information 23 to the host device 2.

This ends the series of operations including the patrol process.

Figure 26:
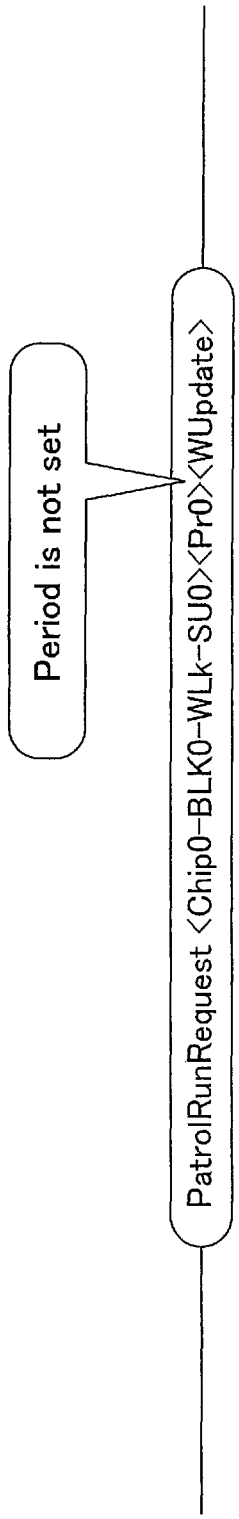
FIG. 26 is a command sequence for illustrating a patrol execution operation in the information processing system according to the second embodiment.

FIG. 26 is an example of a command sequence illustrating the patrol run request in the information processing system according to the second embodiment.

As shown in FIG. 26, the host device 2 issues, for example, patrol run request "PatrolRunRequest<Chip0-BLK0-WLk-SU0><Pr0><WUpdate>". Upon receipt of the command, the memory controller 30 executes the update patrol process on the cell unit CU belonging to the word line WLk and the string unit SU0 of the block BLK0 of the chip 10-0. Because the patrol run request "PatrolRunRequest" does not include information on <period>, the memory controller 30 executes the patrol process only once, and does not repeat it periodically thereafter.

2.2 Advantageous Effects of Present Embodiment

According to the second embodiment, the host device 2 issues patrol run request "PatrolRunRequest" that does not include information on <period>, and transmits it to the memory system 3. Thus, the memory system 3 can execute the patrol process on a spot basis without repeating it periodically based on the instruction from the host device 2. Therefore, it is possible to increase the controllability of the host device 2 when the memory system 3 is caused to execute the patrol process.

In the example described above, the host device 2 issues the patrol run request as a command different from the patrol management information set request, thereby instructing the patrol process executed only once; however, the present invention is not limited thereto. For example, the host device 2 may issue the patrol management information set request to thereby provide instruction of the patrol process executed only once.

Specifically, the only requirement regarding the patrol management information set request is that, in the item of period Pe, information specifying to execute the patrol process only once (e.g., <PeOnce>) be defined. Thereby, it is possible to suppress the increase in the number of commands used by the host device 2.

3. Third Embodiment

Next, an information processing system according to a third embodiment will be described. The third embodiment differs from the first and second embodiments in outputting a patrol mode recommended by the memory system 3 to the host device 2. In the following, the descriptions of the configurations and operations similar to those in the modification of the first embodiment will be omitted, and mainly configurations and operations different from those in the modification of the first embodiment will be described. That is, in the third embodiment, for convenience of explanation, a case where the patrol management information 21 is stored in a table form will be described.

3.1 Patrol Management Information

FIG. 27 is a conceptual diagram illustrating patrol management information of the information processing system according to the third embodiment. FIG. 27 omits illustration of the period and the execution identifier illustrated in FIG. 23 in the modification of the first embodiment.

As shown in FIG. 27, the patrol management information 21 stores a specified patrol mode and a recommended patrol mode for each block BLK. The specified patrol mode is a patrol mode specified by the host device 2. On the other hand, the recommended patrol mode is a patrol mode independent from the specified patrol mode and determined as desirable to be set in the memory system 3.

The memory system 3 sets the recommended patrol mode based on, for example, the result of the patrol process, the state of the NAND flash memory 10, etc. On other hand, the host device 2 acquires the recommended patrol mode from the memory system 3, and uses the recommended patrol mode as reference information when it is determined whether the specified patrol mode is updated. The host device 2 may update the specified patrol mode to a patrol mode equivalent to the recommended patrol mode, or may update the specified patrol mode to a patrol mode different from the recommended patrol mode.

In the example of FIG. 27, for the block BLK0, the same patrol mode B0 is specified by the host device 2 and recommended by the memory system 3. However, for the block BLK1, patrol mode B2 is specified by the host device 2, whereas patrol mode B1 is recommended by the memory system 3. For block BLK2, no patrol mode is specified by the host device 2, whereas patrol mode B1 is recommended by the memory system 3. Similarly, for the same block BLK, there may be a case where the memory system 3 recommends the patrol mode specified by the host device 2, and a case where the memory system 3 recommends the patrol mode not specified by the host device 2.

The memory controller 30 stores, for example, the specified patrol mode and the recommended patrol mode by prioritizing them according to the height of priority Pr and the length of period Pe (execution frequency). In the following description, concerning patrol modes B0 to B3 shown in FIG. 27, for patrol mode B0, the highest priority Pr and the most frequent execution period Pe are set. Next, for patrol modes B1, B2 and B3, priorities Pr and frequent execution periods Pe lower in order are set. Changing the priority Pr of the patrol mode to a higher priority Pr or changing the period Pe to a more frequent execution period Pe will be described as "increasing the level of the patrol mode". Changing the priority Pr of the patrol mode to a lower priority Pr or changing the period Pe to a less frequent execution period Pe will be described as "lowering the level of the patrol mode".

3.2 Patrol Mode Update Operation

Figure 28:
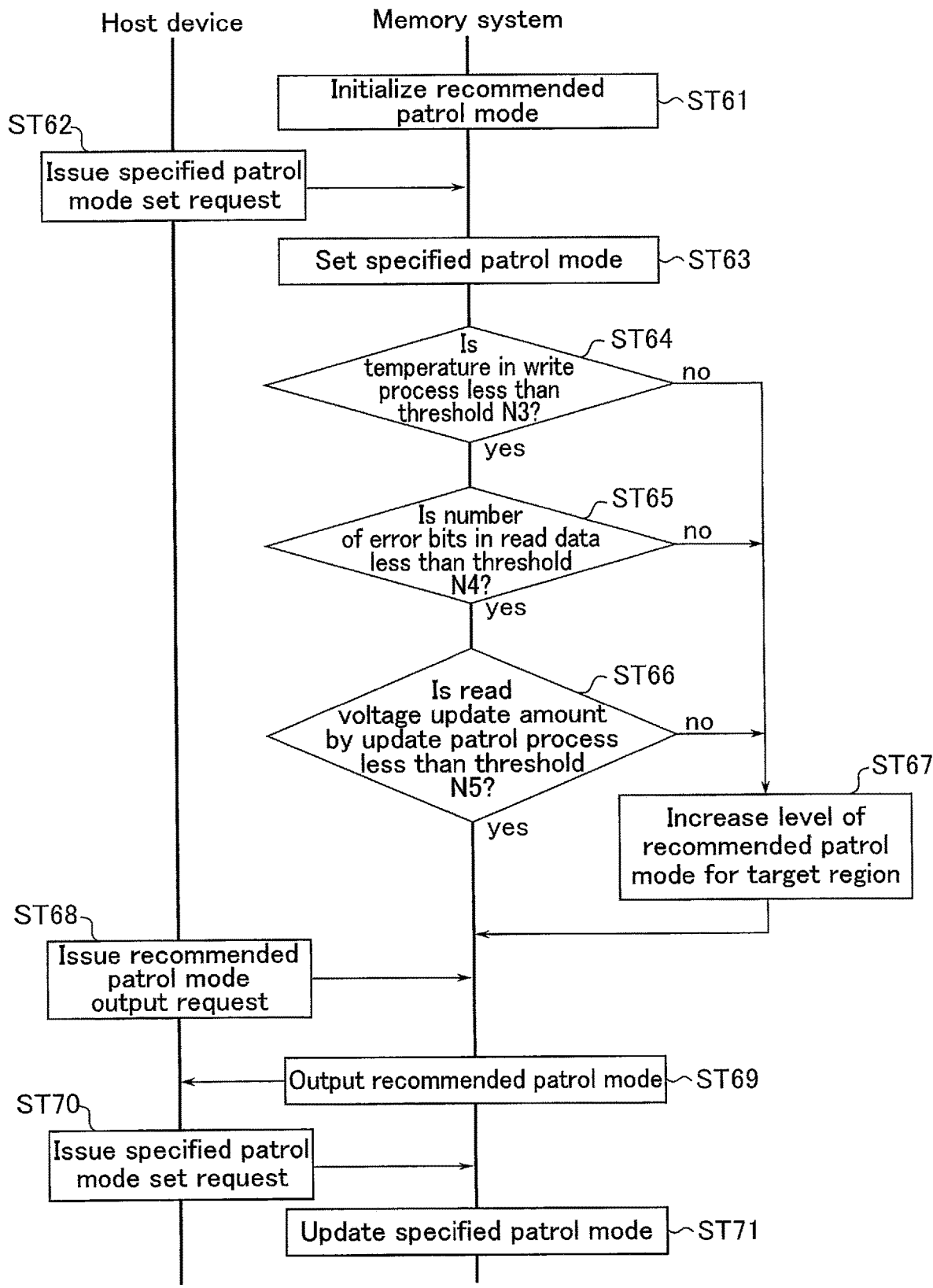
FIG. 28 is a flowchart for illustrating a patrol mode update operation in the information processing system according to the third embodiment.

FIG. 28 is a flowchart illustrating a patrol mode update operation in the information processing system according to the third embodiment.

As shown in FIG. 28, in step ST61, the memory system 3 initializes the recommended patrol mode as the system is activated, for example.

In step ST62, the host device 2 issues a specified patrol mode set request, and transmits it to the memory system 3. The specified patrol mode set request is, for example, a command equivalent to the patrol management information set request "PatrolSet" described in the first embodiment, and includes a patrol mode to be set, and physical address ADD in the NAND flash memory 10 as the target region of the patrol mode.

In step ST63, upon receipt of the specified patrol mode set request, the memory system 3 refers to the patrol management information 21, and sets the specified patrol mode corresponding to the physical address ADD included in the specified patrol management information set request to the patrol management information 21.

In step ST64, the memory system 3 determines whether the temperature at the time of the write process is less than threshold N3. Specifically, for example, when the write process is executed, the NAND flash memory 10 outputs temperature information to the memory controller 30 based on an output from a temperature sensor (not shown) provided in the NAND flash memory 10. The memory controller 30 determines whether the temperature at the time of the write process is less than threshold N3 based on the temperature information from the NAND flash memory 10. If the temperature is threshold N3 or more (step ST64; no), the processing proceeds to step ST67, and if the temperature is less than threshold N3 (step ST64; yes), the processing omits step ST67.

In step ST65, the memory system 3 determines whether the number of error bits of data read by the read process (read data) is less than threshold N4. Specifically, for example, the NAND flash memory 10 outputs the read data to the memory controller 30. The ECC circuit 34 in the memory controller 30 executes the error correction process on the read data, and calculates the number of error bits. The memory controller 30 determines whether the number of error bits calculated is less than threshold N4. If the number of error bits is threshold N4 or more (step ST65; no), the processing proceeds to step ST67, and if the number of error bits is less than threshold N4 (step ST65; yes), the processing omits step ST67.

In step ST66, the memory system 3 determines whether the read voltage update amount by the update patrol process is less than threshold N5. Specifically, for example, the memory controller 30 executes the update patrol process on the NAND flash memory 10 based on the schedule set in the patrol management information 21 or the patrol run request "PatrolRunRequest" from the host device 2. Thereby, the memory controller 30 updates the read voltage applied to the patrol target region of the NAND flash memory 10. The memory controller 30 compares the read voltage before the update and the read voltage after the update, and determines whether the read voltage update amount is less than threshold N5. If the read voltage update amount is threshold N5 or more (step ST66; no), the processing proceeds to step ST67, and if the read voltage update amount is less than threshold N5 (step ST66; yes), the processing omits step ST67.

In step ST67, the memory controller 30 refers to the patrol management information 21, and increases the level of the recommended patrol mode for the target region. Specifically, if it is determined that the temperature is threshold N3 or more in step ST64, the memory controller 30 increases the level of the recommended patrol mode set for the write target region. If it is determined that the number of error bits is threshold N4 or more in step ST65, the memory controller 30 increases the level of the recommended patrol mode set for the read target region. If it is determined that the read voltage update amount is threshold N5 or more in step ST66, the memory controller 30 increases the level of the recommended patrol mode set for the target region of the update patrol process. In step ST67, the specified patrol mode does not change, and therefore, the level of the patrol mode of the patrol process executed subsequently does not change.

In step ST68, the host device 2 issues a recommended patrol mode output request (command set), and transmits it to the memory system 3. The recommended patrol mode output request includes, for example, physical address ADD in the NAND flash memory 10 as a target region of the recommended patrol mode requesting the output.

In step ST69, upon receipt of the recommended patrol mode output request, the memory system 3 refers to the patrol management information 21, and outputs the recommended patrol mode corresponding to the physical address ADD included in the recommended patrol mode output request.

In step ST70, the host device 2 issues a specified patrol mode set request, and transmits it to the memory system 3. The specified patrol mode set request includes, for example, a patrol mode shared between the host device 2 and the memory system 3.

The host device 2 may include a new patrol mode not supplied between the host device 2 and the memory system 3 in the specified patrol mode set request as a specified patrol mode. In this case, the host device 2 may issue the specified patrol mode set request after the new patrol mode is defined as shown in FIGS. 11, 13 and 15. The host device 2 directly transmits a plurality of patrol management information set requests constituting the patrol mode to the memory controller 30.

In step ST71, upon receipt of the specified patrol mode set request, the memory system 3 refers to the patrol management information 21, and updates the specified patrol mode corresponding to the physical address ADD included in the specified patrol mode set request to the patrol mode included in the specified patrol mode set request.

This ends the patrol mode update operation.

In the example of FIG. 28, steps ST64 to ST66 are executed in this order; however, the present invention is not limited thereto. That is, because steps ST64 to ST66 are processes executed according to the corresponding write process, read process, and update patrol process, respectively, the execution order of steps ST64 to ST66 shown in FIG. 28 is discretionary.

Figure 29:
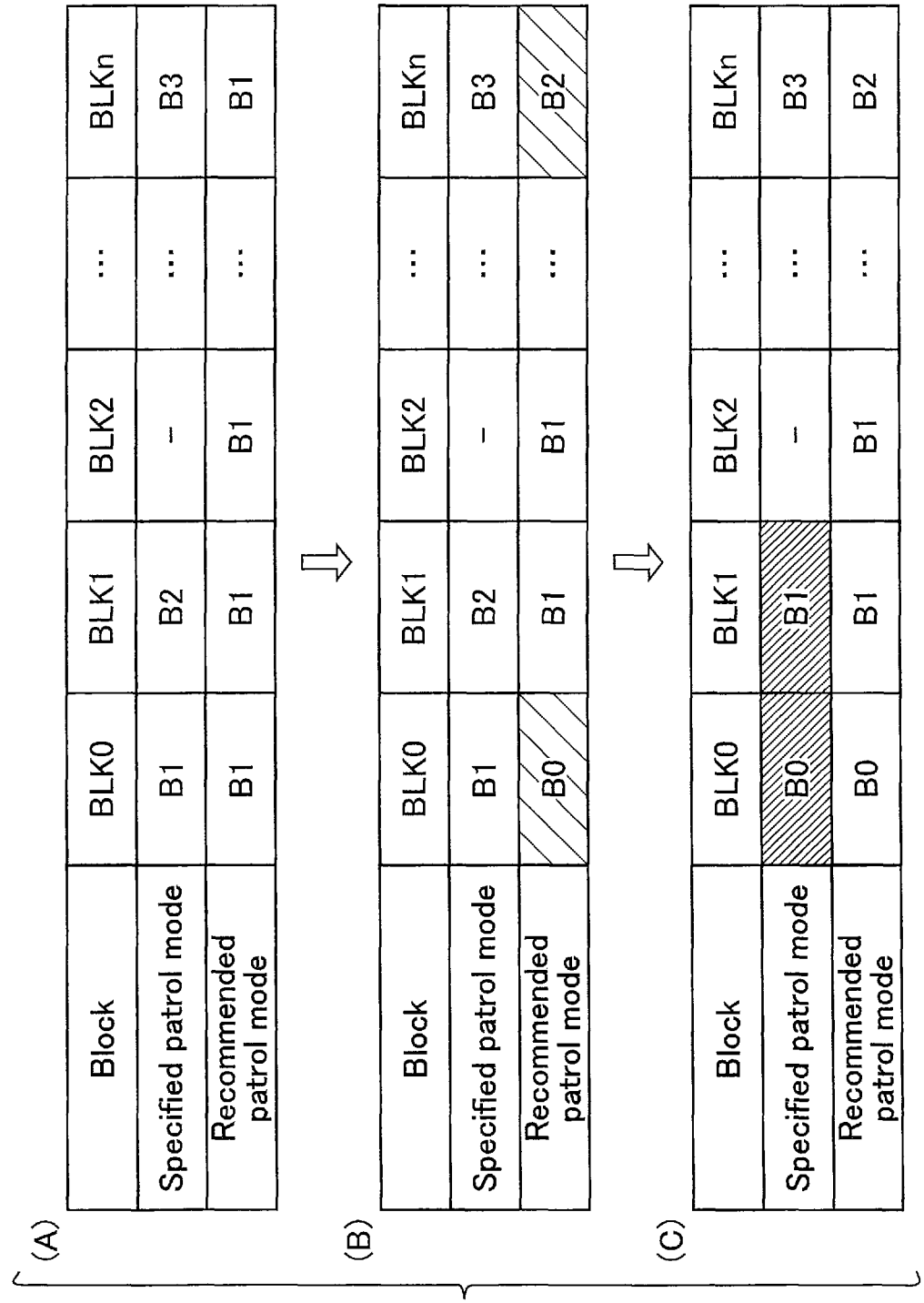
FIG. 29 is a schematic diagram for illustrating the patrol mode update operation in the information processing system according to the third embodiment.

FIG. 29 is a schematic diagram illustrating a patrol mode update operation in the information processing system according to the third embodiment. FIG. 29(A) shows the patrol management information 21 in a state after execution of step ST63 of FIG. 28. FIG. 29(B) shows the patrol management information 21 in a state after execution of step ST67 of FIG. 28. FIG. 29(C) shows the patrol management information 21 in a state after execution of step ST71 of FIG. 28.

As shown in FIG. 29(A), the memory controller 30 sets, as an initial state, the same patrol mode B1 for recommended patrol modes of all blocks BLK. On the other hand, the host device 2 specifies different patrol modes in accordance with a use state of block BLK (e.g., the number of erasures).

Specifically, for example, the host device 2 specifies the patrol mode B1 for the block BLK0 in which the number of erasures is relatively large, and specifies the patrol mode B2 of a lower level for the block BLK1 in which the number of erasures is relatively small. For the block BLKn used as a copy region, the host device 2 specifies the patrol mode B3 of a level lower than those of other blocks BLK. Further, the host device 2 does not specify a specific patrol mode for unused block BLK2.

As shown in FIG. 29(B), by executing the write process, read process, and update patrol process on the NAND flash memory 10, the memory controller 30 acquires various information items.

For example, the memory controller 30 determines that the threshold voltage distribution in the block BLK0 is in a situation of easily variable based on the temperature of the NAND flash memory 10 at the time of the write process executed on the block BLK0 being threshold N3 or more. Therefore, for the recommended patrol mode of the block BLK0, the memory controller 30 sets the patrol mode B0 of a level one stage higher than that of the specified patrol mode B1.

Further, for example, the memory controller 30 determines that the threshold voltage distribution in the block BLK1 varies based on the number of error bits of the read data from the block BLK1 being threshold N4 or more. Therefore, for the recommended patrol mode of the block BLK1, the memory controller 30 sets the patrol mode B1 of a level one stage higher than that of the specified patrol mode B2. In the case of FIG. 29(B), as a result, the level of the recommended patrol mode of the block BLK1 does not change.

For example, the memory controller 30 determines that the threshold voltage distribution in the block BLKn varies based on the read voltage update amount at the time of the update patrol process executed on the block BLKn being threshold N5 or more. Therefore, for the recommended patrol mode of the block BLKn, the memory controller 30 sets the patrol mode B2 of the level one stage higher than that of the specified patrol mode B3.

As shown in FIG. 29(C), the host device 2 updates the specified patrol mode based on the recommended patrol mode received from the memory controller 30.

For example, for the blocks BLK0 and BLK1, the host device 2 specifies the patrol modes B0 and B1, respectively, in accordance with the recommended patrol mode. On the other hand, because the block BLKn is a copy region, the host device 2 determines that there is no need to increase the level of the patrol mode, and continuously specifies the patrol mode B3.

If operated as described above, the host device 2 can voluntarily specify the patrol mode while referring to the recommended patrol mode from the memory system 3.

3.3 Advantageous Effects of Present Embodiment

According to the third embodiment, the host device 2 issues the recommended patrol mode output request. In response to the recommended patrol mode output request, the memory system 3 outputs, to the host device 2, the recommended patrol mode that is set independent from the patrol mode specified from the host device 2. Thus, the host device 2 can acquire the patrol mode recommended by the memory system 3 that may differ from the specified patrol mode, and can refer to the recommended patrol mode when the specified patrol mode in the memory system 3 is updated. Thus, it is possible to increase the controllability of the patrol process of the host device 2.

The memory controller 30 sets the recommended patrol mode based on the temperature at the time of the write process on the NAND flash memory 10, the number of error bits of the read data, or the read voltage update amount. Thereby, when detecting a situation where the read voltage is likely to vary more than expected, the memory controller 30 can set a recommended patrol mode of the level higher than that of the specified patrol mode Therefore, when the host device 2 sets a specified patrol mode, favorable information based on information that the host device 2 does not know can be provided to the host device 2.

3.4 Modification of Third Embodiment

The third embodiment is not limited to the above-described example and can be modified in various manners.

For example, in the third embodiment described above, regardless of whether there is a request from the host device 2, the memory controller 30 sets the recommended patrol mode as appropriate based on the temperature at the time of write process, the number of error bits of the read data, the read voltage update amount, etc.; however, the present invention is not limited thereto. For example, in response to the request from the host device 2, the memory controller 30 may inquire the NAND flash memory 10 for information for setting the recommended patrol mode. In the following, the descriptions of the configurations and operations similar to those in the third embodiment will be omitted, and mainly configurations and operations different from those in the third embodiment will be described.

FIG. 30 is a flowchart illustrating a recommended patrol mode output operation in the information processing system according to a modification of the third embodiment.

As shown in FIG. 30, in step ST68, the host device 2 issues a recommended patrol mode output request, and transmits it to the memory controller 30.

In step ST81, upon receipt of the recommended patrol mode output request, the memory controller 30 inquires the NAND flash memory 10 for the recommended patrol mode.

In step ST82, in response to the inquiry from the memory controller 30, the NAND flash memory 10 provides the patrol mode that the NAND flash memory 10 recommends.

In step ST69, the memory controller 30 outputs the recommended patrol mode received from the NAND flash memory 10 to the host device 2.

If operated as described above, the memory controller 30 can output, to the host device 2, the recommended patrol mode reflecting the request from the NAND flash memory 10.

In the example of FIG. 30, the NAND flash memory 10 concretely defines the patrol mode for the memory controller 30, but the present invention is not limited thereto.

For example, in response to the inquiry from the memory controller 30, the NAND flash memory 10 may transmit, to the memory controller 30, the device ID of each of chips 10-0 to 10-N constituting its own. Thus, even in the case of including a memory cell array 17 in which each of chips 10-0 to 10-N has a different structure (e.g., different blocks BLK, string units SU, word lines WL, and numbers of bit lines BL), a suitable patrol mode corresponding to the structure can be set.

For example, in response to an inquiry from the memory controller 30, the NAND flash memory 10 may transmit, to the memory controller 30, information of a defective block BLK. Thereby, the memory controller 30 can obtain more detailed information regarding defectiveness or non-defectiveness of each block BLK. Therefore, the memory controller 30 can set a high-accuracy recommended patrol mode.

4. Other

In the first to third embodiments described above, the read voltage is updated in accordance with the degree of overlapping of the threshold voltage distributions, but the present invention is not limited thereto. For example, the read voltage may be updated by estimating a threshold voltage at which the overlapping threshold voltage distributions intersect each other.

Figure 31:
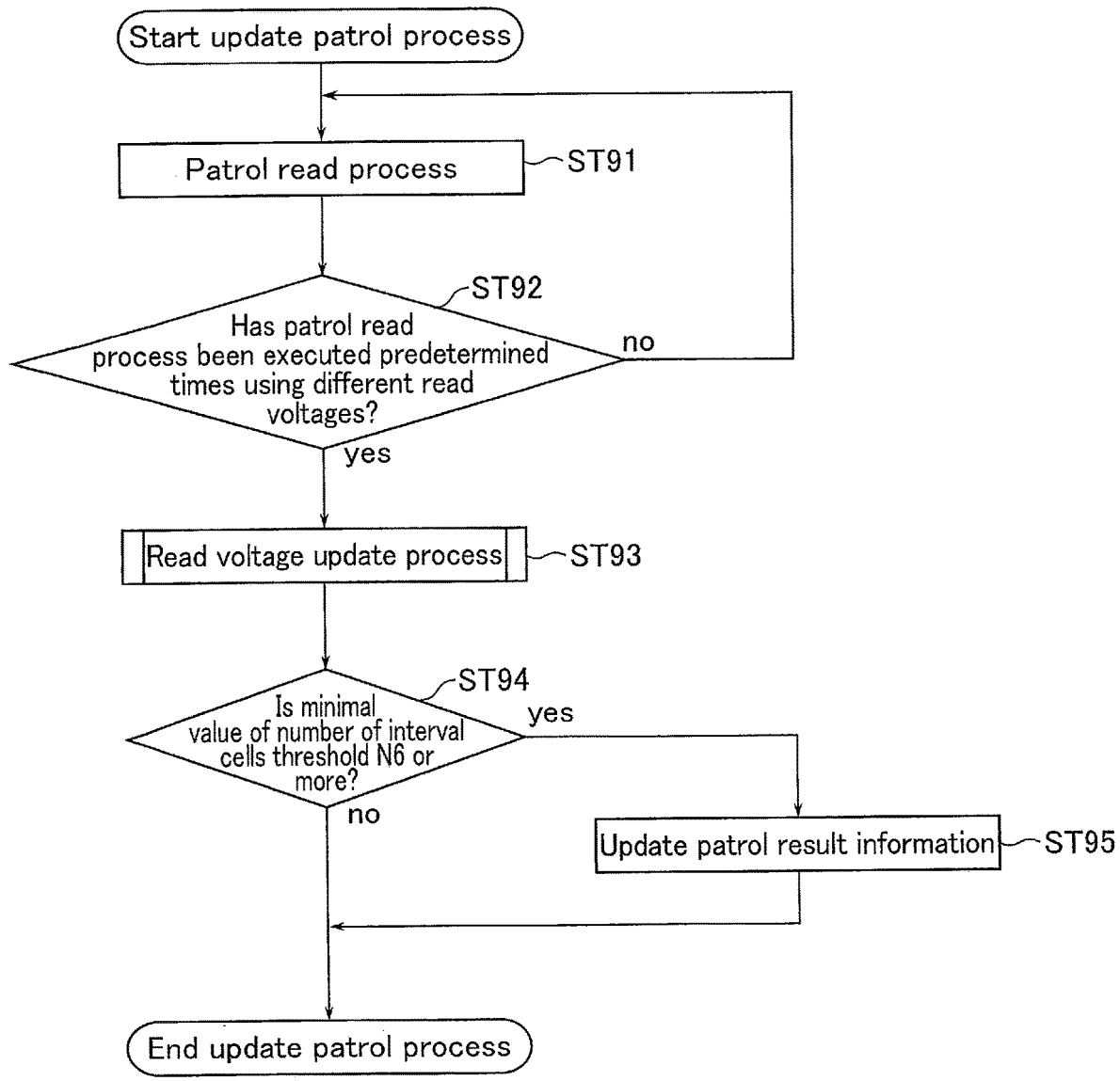
FIG. 31 is a flowchart for illustrating an update patrol process in an information processing system according to another modification.

FIG. 31 is a flowchart for illustrating an update patrol process in an information processing system according to another modification.

As shown in FIG. 31, in step ST91, the memory system 3 executes the patrol read process. The patrol read process in step ST91 may, in a manner similar to the patrol read process in step ST31 of FIG. 19, read data of a specified page in the cell unit CU, or may read data using only one read voltage.

In step ST92, the memory controller 30 determines whether the patrol read process is executed predetermined times using different read voltages. If the patrol read process has been executed predetermined times (step ST92; yes), the processing proceeds to step ST93, and if the patrol read process has not been executed predetermined times (step ST92; no), the processing returns to step ST91. Thereby, the memory controller 30 shifts the read voltage used for the patrol read process little by little until the patrol read process is executed predetermined times.

In step ST93, the memory controller 30 executes a read voltage update process using data that is read predetermined times while the read voltage is shifted in step ST91. For example, the memory controller 30 calculates the number of memory cells that are turned to on-state (the number of on-cells) for each of the predetermined number of read voltages. Based on the amount of change in the number of on-cells (the number of interval cells), the memory controller 30 calculates an update value of the read voltage, and stores a DAC value corresponding to the calculated updated read voltage. The read voltage update process will be described later.

In step ST94, it is determined whether the minimal value of the number of interval cells is threshold N6 or more. If the minimal value of the number of interval cells is threshold N6 or more (step ST94; yes), the processing proceeds to step ST95, and if the minimal value of interval cells is less than threshold N6 (step ST94; no), the update patrol process ends.

In step ST95, the memory controller 30 updates the refresh flag corresponding to the block BLK including the patrol target in the patrol result information 22 to "True". Thereby, the memory controller 30 can store that the number of interval cells of the patrol target is threshold N6, and that the block BLK including the patrol target requires the refresh process.

This ends the update patrol process.

Figure 32:
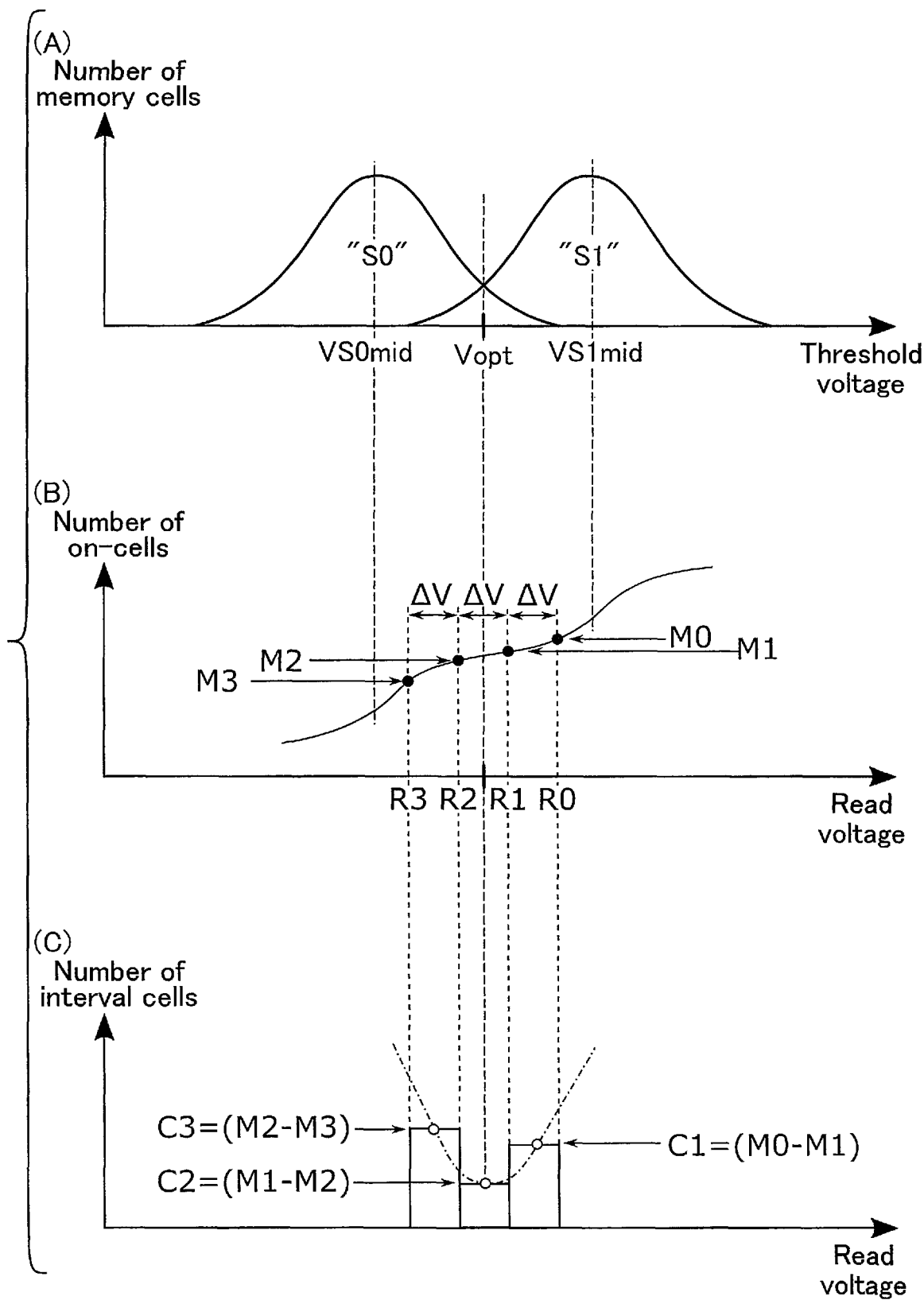
FIG. 32 is a schematic diagram for illustrating an update patrol process in an information processing system according to another modification.

FIG. 32 is a schematic diagram illustrating a read voltage update process in the information processing system according to another modification. FIG. 32(A) shows an example of two threshold voltage distributions corresponding to the "S0" state and the "S1" state. FIG. 32(B) shows a change in the number of on-cells. FIG. 32(C) shows an amount of change in the number of on-cells between two read voltages, i.e., change the number of interval cells. Those shown in FIGS. 32(B) and 32(C) are plotted in conformity with the cell unit CU having the threshold voltage distributions shown in FIG. 32(A).

As shown in FIG. 32(B), if the read voltage is shifted to the low-voltage side, the number of on-cells rapidly decreases at a voltage slightly higher than voltage VS1*mid* which is a mode value of the "S1" state, and |dM/dR| is maximal. The mode value is a voltage in which the threshold voltage distribution probability is the highest in FIG. 32(A), and M is the number of on-cells and R is the read voltage. As the read voltage is further lowered, the decrease rate of the number of on-cells decreases, and the decrease rate of the number of on-cells at a read voltage of a certain value becomes minimal. The minimal value of the decrease rate of the number of on-cells is zero when the threshold voltage distribution belonging to the "S1" state and that belonging to the "S0" state do not overlap. In contrast, the minimal value of the decrease rate of the number of on-cells is a value that is not zero (>0) when the threshold voltage distribution belonging to the "S1" state and that belonging to the "S0" state overlap. As the read voltage is further lowered, the decrease rate of the number of on-cells increases again, and |dM/dR| is the maximal again at a voltage slightly higher than voltage VS0*mid* that is a mode value of the "S0" state.

By the change in the number of on-cells described above, it is possible to detect the read voltage in which the overlapping of the threshold voltage distributions between the two states is smallest (i.e., the read voltage corresponding to the intersect of the threshold voltage distributions of the two states). For example, first, the patrol read process is performed using a read voltage R0. The number of on-cells at this time is assumed to be M0. Next, the patrol read process is performed using a voltage R1 that is lower than the voltage R0 by ΔV. The number of on-cells at this time is assumed to be M1. Then, the number of memory cell transistors MT newly turned off when the read voltage decreases from R0 to R1 is C1=M0−M1. That is, the number of interval cells between [R0,R1] of the threshold voltages is C1.

Next, the patrol read process is performed using a voltage R2 that is lower than the voltage R1 by ΔV. The number of on-cells at this time is assumed to be M2. Then, the number of memory cell transistors MT newly turned off when the read voltage decreases from R1 to R2 is C2=M1−M2. That is, the number of interval cells between [R1,R2] of the threshold voltages is C2. If C1>C2, the voltage in which |dM/dR| is minimal is considered to be located on the low-voltage side with respect to at least the voltage R1.

Next, the patrol read process is performed using a voltage R3 that is lower than the voltage R2 by ΔV. The number of on-cells at this time is assumed to be M3. Then, the number of memory cell transistors MT newly turned off when the read voltage decreases from R2 to R3 is C3=M2−M3. That is, the number of interval cells between [R2,R3] of the threshold voltages is C3. If C3>C2, a histogram as shown in FIG. 32(C) is obtained.

As a result, by the number of interval cells, it is possible to estimate the threshold voltage distribution as shown by the dashed-dotted line in FIG. 32(C). Then, it is possible to estimate that a read voltage in which the overlapping of the threshold voltage distribution belonging to the "S0" state and the threshold voltage distribution belonging to the "S1" state is the smallest is present between the voltage R1 and the voltage R2 (the interval in which the number of interval cells is the minimal value).

The memory controller 30 updates the read voltage to the voltage value in the interval in which the number of interval cells is the minimal value. Thereby, it is possible to update the read voltage to be closer to the ideal voltage value Vopt.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory system, comprising:
   a nonvolatile memory; and
   a memory controller configured to, in response to a first command set from a host device, the first command set specifying a first period as an interval of a patrol process, repeatedly execute the patrol process every specified interval,
   wherein, in the patrol process, the memory controller is configured to:
   read first data from the nonvolatile memory; and
   not output the first data to the host device.

2. The memory system of claim 1, wherein the first command set further specifies a memory region associated with the first data in the nonvolatile memory.

3. The memory system of claim 1, wherein the memory controller is configured to output, to the host device, information indicative of whether the patrol process is repeatedly executed every specified interval, in response to a second command from the host device, after receipt of the first command set.

4. The memory system of claim 1, wherein the first command set further specifies a first priority as a priority of the patrol process.

5. The memory system of claim 4, wherein the memory controller is configured to:
execute a host read process that reads second data from the nonvolatile memory and outputs the second data to the host device, in response to a third command set from the host device; and
determine whether to execute the patrol process in priority to the host read process based on the specified priority.

6. The memory system of claim 1, wherein
the first command set further specifies whether the patrol process is a first patrol process or a second patrol process, and
the memory controller is configured to,
in the first patrol process and the second patrol process, detect an error contained in the first data,
in the second patrol process,
generate third data in which the error contained in the first data has been corrected, and
update a read voltage applied to the nonvolatile memory based on the first data and the third data.

7. The memory system of claim 6, wherein the memory controller is configured to output, to the host device, information indicative of whether the number of error bits detected is a threshold or more, in response to a fourth command from the host device, after the patrol process is executed.

8. The memory system of claim 1, wherein the memory controller is configured to cancel execution of the patrol process, in response to a fifth command set from the host device, after receipt of the first command set.

9. The memory system of claim 1, wherein
the first command set further specifies a first priority as a priority of the patrol process, and
the memory controller is configured to output, to the host device, information including a second period as the interval of the patrol process or a second priority as the priority of the patrol process, in response to a sixth command set regarding the patrol process from the host device, after receipt of the first command set.

10. The memory system of claim 9,
wherein the second period differs from the first period, and
the second priority differs from the first priority.

11. The memory system of claim 9, wherein the memory controller is configured to acquire information including the second period or the second priority from the nonvolatile memory, in response to the sixth command set.

12. The memory system of claim 9,
wherein the memory controller is configured to, in response to the sixth command set:
acquire a device ID from the nonvolatile memory; and
output the information including the second period or the second priority to the host device based on the device ID.

13. An information processing system, comprising:
a memory system; and
a host device configured to transmit a first command set to the memory system,
the memory system, including:
a nonvolatile memory; and
a memory controller configured to, in response to the first command set, the first command set specifying a first period as an interval of a patrol process, repeatedly execute the patrol process every specified interval,
wherein, in the patrol process, the memory controller is configured to:
read first data from the nonvolatile memory; and
not output the first data to the host device.

14. The information processing system of claim 13, wherein the first command set further specifies a memory region associated with the first data in the nonvolatile memory.

15. The information processing system of claim 13, wherein the first command set further specifies a first priority as a priority of the patrol process.

16. The information processing system of claim 13, wherein the memory controller is configured to output, to the host device, information indicative of whether the patrol process is repeatedly executed every specified interval, in response to a second command from the host device, after receipt of the first command set.

17. The information processing system of claim 15, wherein
the memory controller is configured to output, to the host device, information including a second period as the interval of the patrol process or a second priority as the priority of the patrol process, in response to a third command set regarding the patrol process from the host device, after receipt of the first command set.

18. The information processing system of claim 17,
wherein the second period differs from the first period, and
the second priority differs from the first priority.

19. The information processing system of claim 17, wherein the memory controller is configured to acquire information including the second period or the second priority from the nonvolatile memory, in response to the third command set.

20. The information processing system of claim 17,
wherein the memory controller is configured to, in response to the third command set:
acquire a device ID from the nonvolatile memory; and
output the information including the second period or the second priority to the host device based on the device ID.

* * * * *